(12) United States Patent
Op de Beeck et al.

(10) Patent No.: US 10,910,342 B2
(45) Date of Patent: Feb. 2, 2021

(54) METHOD FOR TRANSFERRING AND PLACING A SEMICONDUCTOR DEVICE ON A SUBSTRATE

(71) Applicants: IMEC VZW, Leuven (BE); Universiteit Gent, Ghent (BE)

(72) Inventors: Maria Op de Beeck, Heverlee (BE); Bjorn Vandecasteele, Harelbeke (BE)

(73) Assignees: IMEC VZW, Leuven (BE); UNIVERSITEIT GENT, Ghent (BE)

( * ) Notice: Subject to any disclaimer, the term of this patent is extended or adjusted under 35 U.S.C. 154(b) by 0 days.

(21) Appl. No.: 15/836,634

(22) Filed: Dec. 8, 2017

(65) Prior Publication Data
US 2018/0166416 A1 Jun. 14, 2018

(30) Foreign Application Priority Data
Dec. 8, 2016 (EP) ..................................... 16202839

(51) Int. Cl.
*H01L 23/00* (2006.01)
*H01L 21/683* (2006.01)
(Continued)

(52) U.S. Cl.
CPC .......... *H01L 24/96* (2013.01); *H01L 21/6835* (2013.01); *H01L 24/93* (2013.01);
(Continued)

(58) Field of Classification Search
CPC . H01L 2224/24137; H01L 2924/10158; H01L 24/97; H01L 24/25; H01L 2224/95121; H01L 2224/83192; H01L 2221/68354; H01L 2224/96; H01L 2224/95001; H01L 2924/10156; H01L 2224/83132; H01L 24/83; H01L 2224/83005
See application file for complete search history.

(56) References Cited

U.S. PATENT DOCUMENTS 6,528,864 B1 *  3/2003  Arai .................... H01L 21/3043
                                                    257/620
2011/0241190 A1 * 10/2011  Elian ...................... H01L 21/56
                                                    257/676

FOREIGN PATENT DOCUMENTS

JP           09007975 A  * 1/1997

* cited by examiner

*Primary Examiner* — Syed I Gheyas
(74) *Attorney, Agent, or Firm* — Mcdonnell Boehnen Hulbert & Berghoff LLP

(57) ABSTRACT

An example embodiment may include a method for placing on a carrier substrate a semiconductor device. The method may include providing a semiconductor substrate comprising a rectangular shaped assist chip, which may include at least one semiconductor device surrounded by a metal-free border. The method may also include dicing the semiconductor substrate to singulate the rectangular shaped assist chip. The method may further include providing a carrier substrate having adhesive thereon. The method may additionally include transferring to and placing on the carrier substrate the rectangular shaped assist chip, thereby contacting the adhesive with the rectangular shaped assist chip at least at a location of the semiconductor device. The method may finally include singulating the semiconductor device, while remaining attached to the carrier substrate by the adhesive, by removing a part of rectangular shaped assist chip other than the semiconductor device.

20 Claims, 21 Drawing Sheets

(51) Int. Cl.
*H01L 29/06* (2006.01)
*H01L 23/544* (2006.01)

(52) U.S. Cl.
CPC ........ *H01L 29/0657* (2013.01); *H01L 23/544* (2013.01); *H01L 24/25* (2013.01); *H01L 24/81* (2013.01); *H01L 24/83* (2013.01); *H01L 24/97* (2013.01); *H01L 2221/68354* (2013.01); *H01L 2224/24137* (2013.01); *H01L 2224/24226* (2013.01); *H01L 2224/25175* (2013.01); *H01L 2224/2919* (2013.01); *H01L 2224/29036* (2013.01); *H01L 2224/30166* (2013.01); *H01L 2224/818* (2013.01); *H01L 2224/81132* (2013.01); *H01L 2224/83005* (2013.01); *H01L 2224/8338* (2013.01); *H01L 2224/83132* (2013.01); *H01L 2224/83192* (2013.01); *H01L 2224/83855* (2013.01); *H01L 2224/93* (2013.01); *H01L 2224/95001* (2013.01); *H01L 2224/95121* (2013.01); *H01L 2224/96* (2013.01); *H01L 2224/97* (2013.01); *H01L 2924/10156* (2013.01); *H01L 2924/10157* (2013.01); *H01L 2924/10158* (2013.01); *H01L 2924/1515* (2013.01)

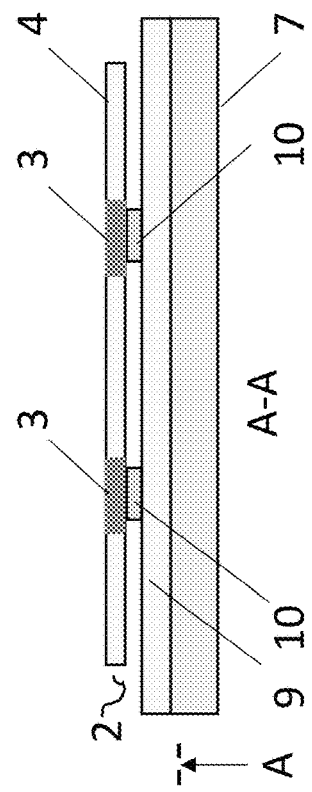
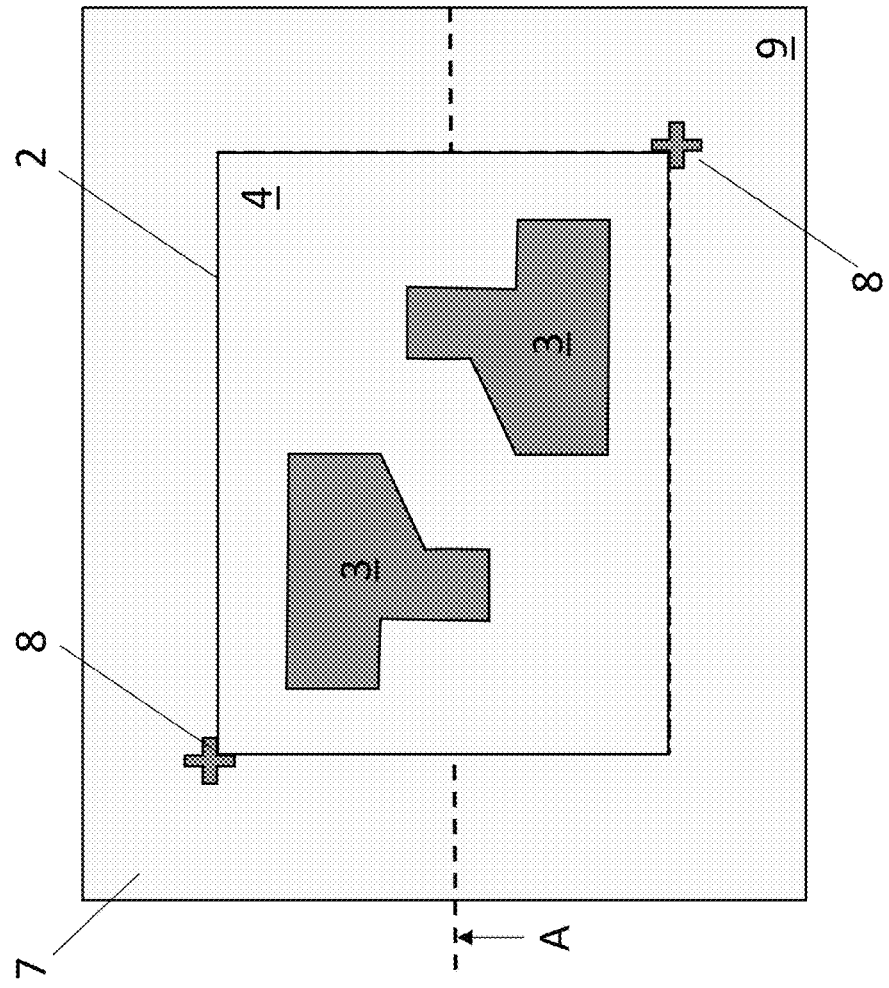
FIG. 5b
FIG. 5a

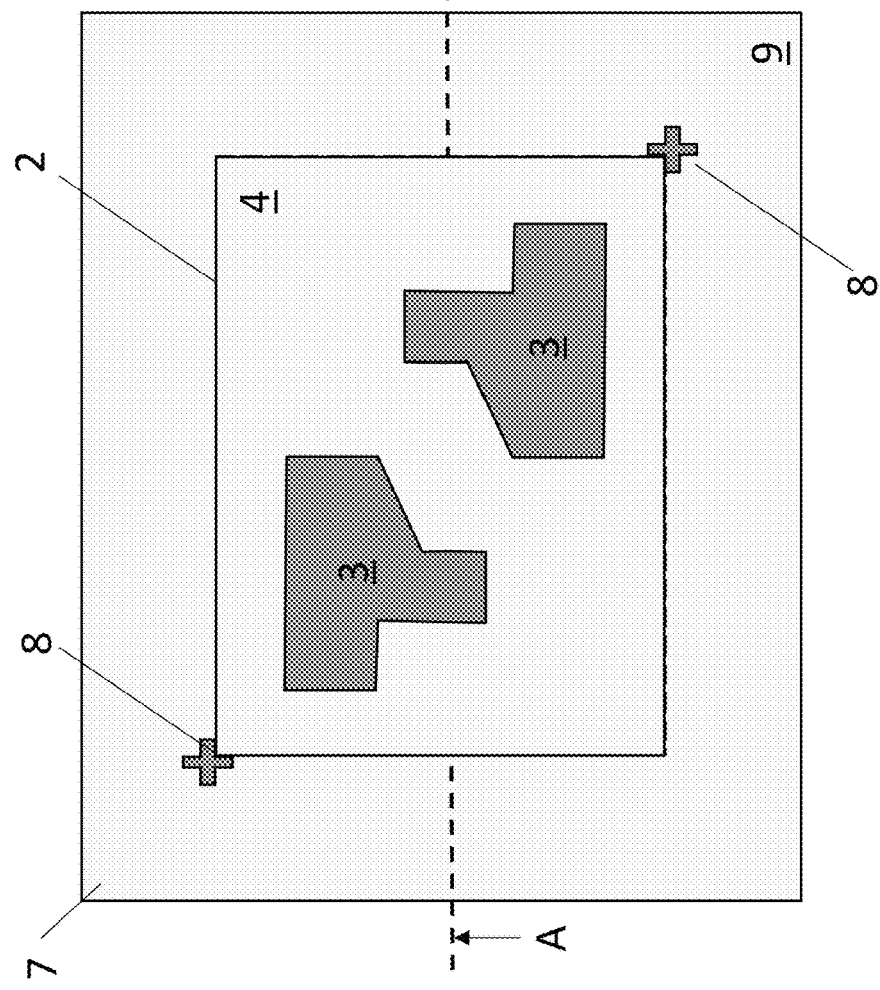
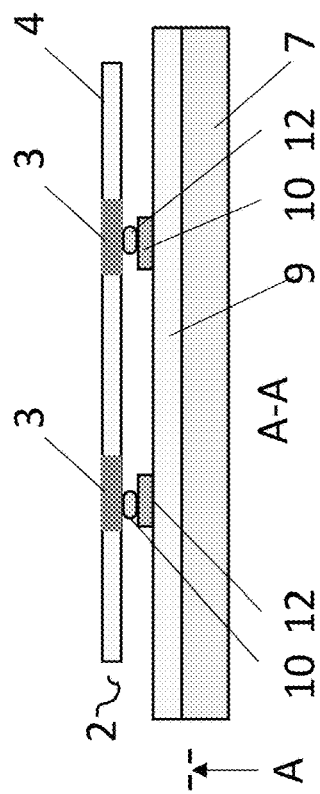
FIG. 6a
FIG. 6b

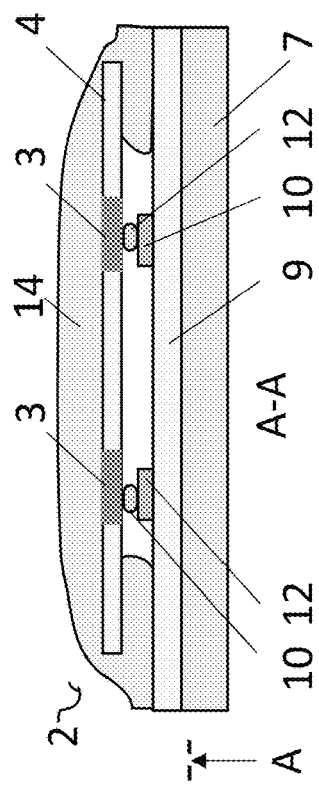
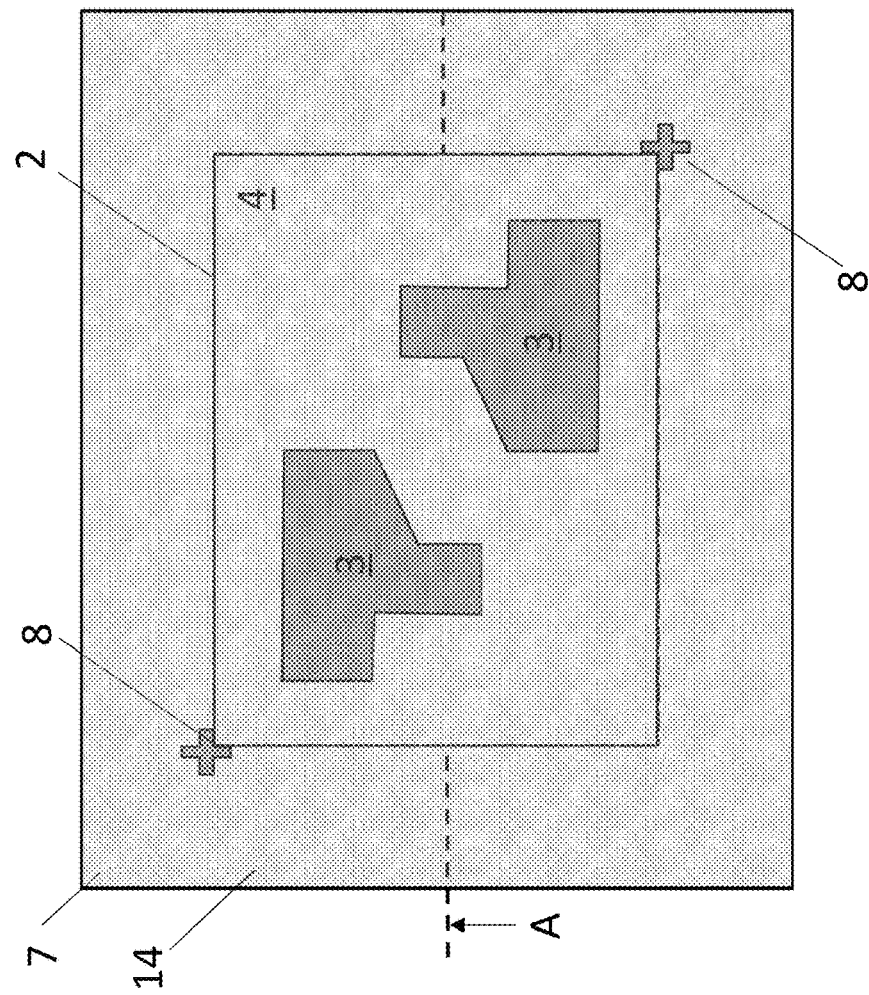
FIG. 8b
FIG. 8a

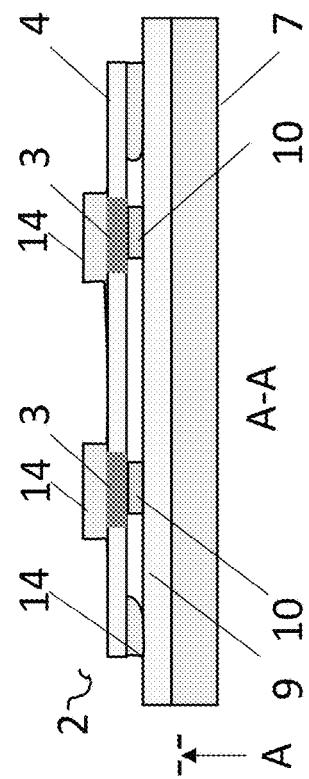
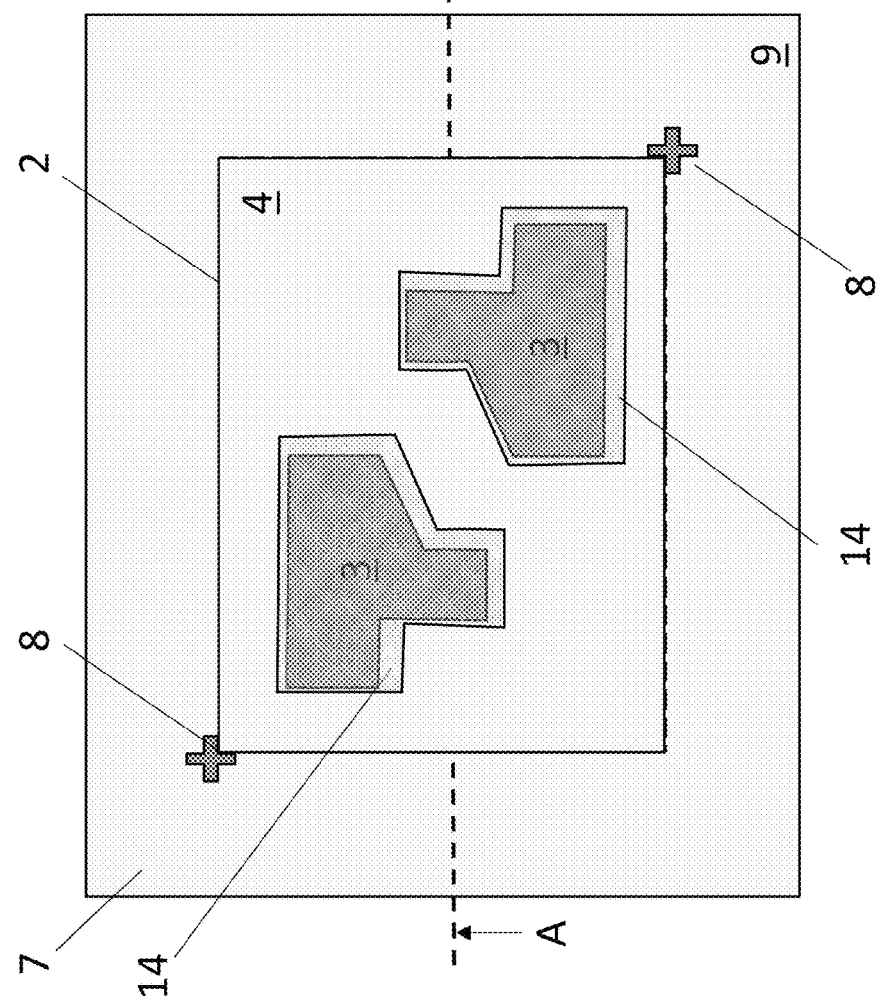
FIG. 9b
FIG. 9a

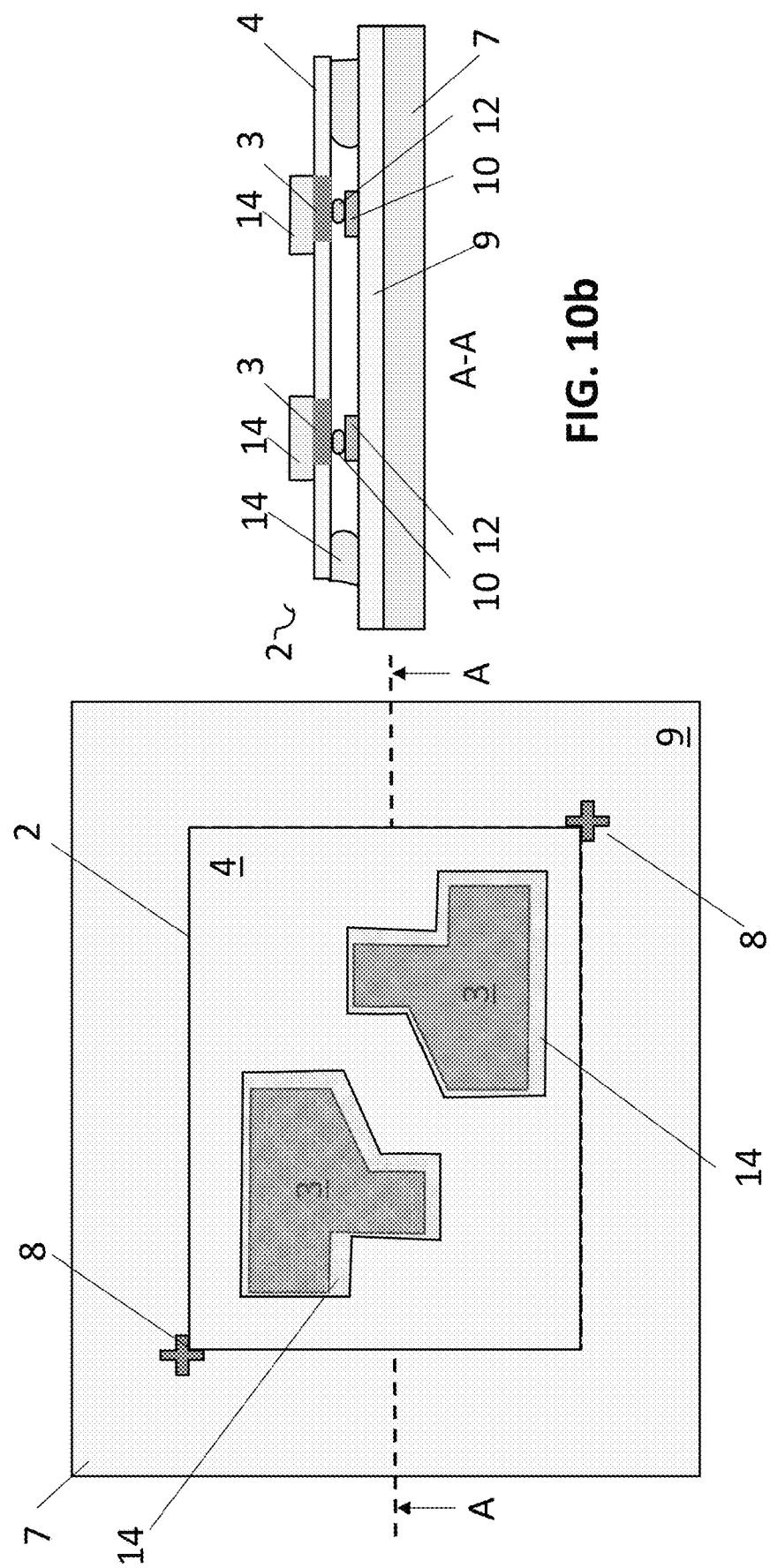

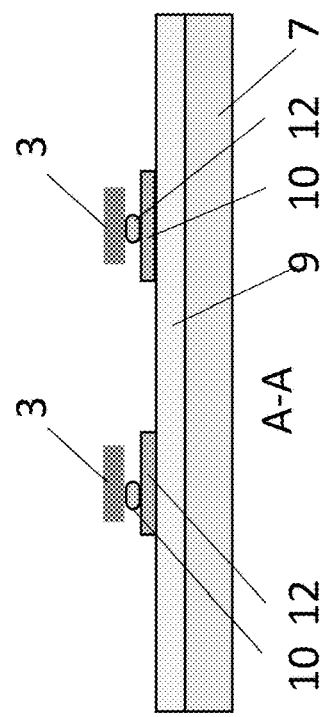
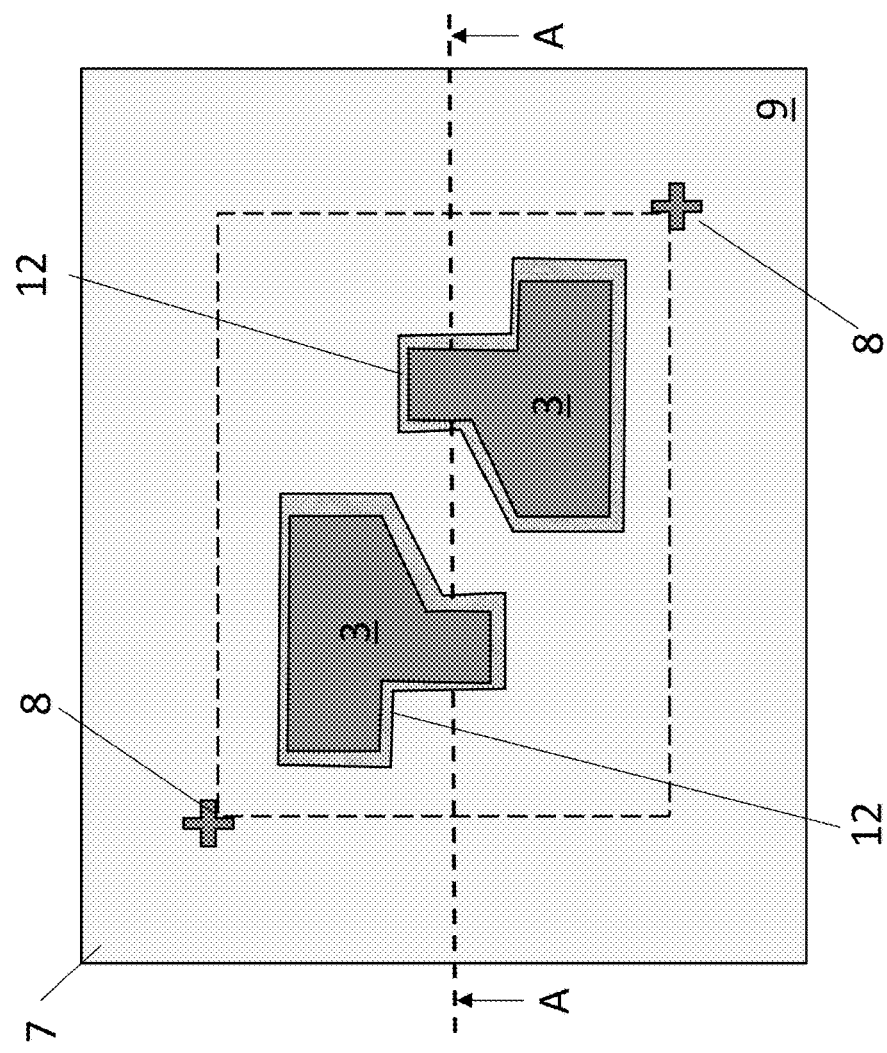
FIG. 12b
FIG. 12a

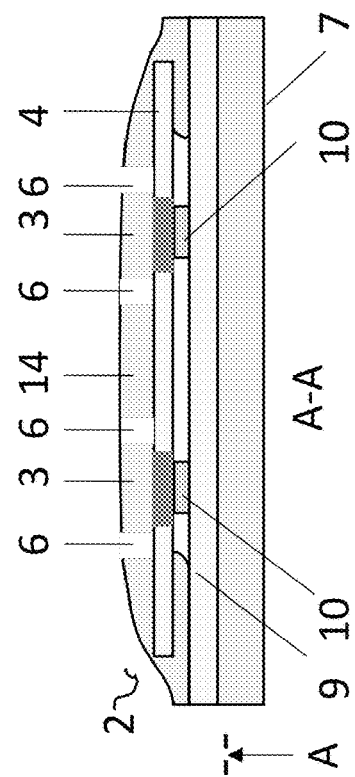
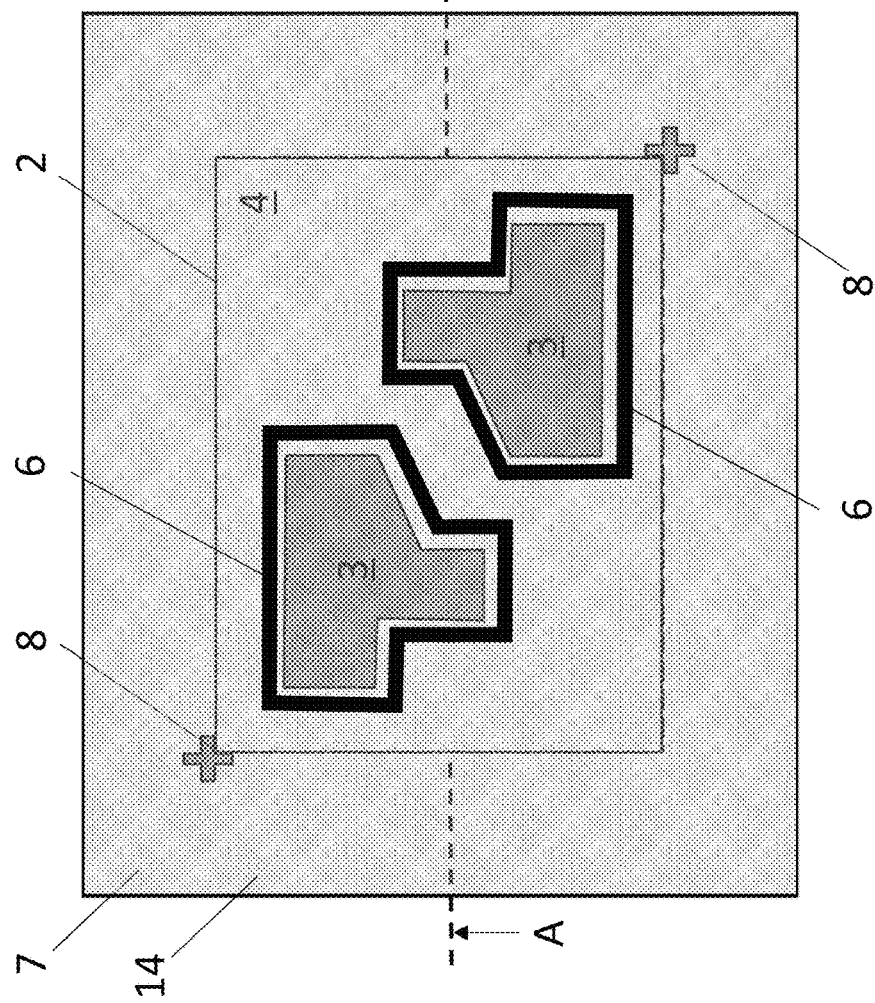
FIG. 13b
FIG. 13a

METHOD FOR TRANSFERRING AND PLACING A SEMICONDUCTOR DEVICE ON A SUBSTRATE

CROSS-REFERENCE TO RELATED APPLICATIONS

The present application is a non-provisional patent application claiming priority to European Patent Application No. 16202839.3, filed Dec. 8, 2016, the contents of which are hereby incorporated by reference.

FIELD OF THE DISCLOSURE

The present disclosure relates to methods for placing semiconductor devices, such as Integrated Circuits and/or micro-electromechanical devices (MEMS), on another substrate.

In particular, this disclosure relates to methods for placing a semiconductor device to another substrate. In particular this disclosure relates to methods for placing one or more arbitrarily shaped semiconductor devices to another substrate.

BACKGROUND

Semiconductor devices, such as Integrated Circuits and micro-electromechanical devices (MEMS), are manufactured using semiconductor process technology enabling highly accurate alignment of individual patterns needed to create a semiconductor device. Afterwards, these devices can be transferred to and placed onto another substrate, e.g. for post-processing or for chip packaging. Typically they are placed individually using a pick-and-place tool.

Although advanced pick-and-place tools have sufficient alignment capabilities, their accuracy of placing the individual devices is considerably less than the accuracy obtained with state-of-the-art lithographic tools used for fabrication of the semiconductor devices. Consequently, in post-processing or packaging the transferred semiconductor devices, one has to take into account this reduced placement accuracy. Devices transferred to a common substrate may be misaligned towards each-other. In addition, features patterned on a transferred device, during a post processing or packaging process should be sufficiently large to avoid misalignment towards the transferred device. In case narrow patterns on a transferred device are required, device by device processing of such narrow pattern is needed to ensure an acceptable alignment of each narrow pattern to the corresponding transferred device. As parallel processing is not feasible, this will result in a low fabrication speed.

Pick-and-place tools are designed to handle the transfer of rectangular shaped semiconductor devices, obtained by dicing the semiconductor substrate, used to manufacture these devices, into rectangular chips. Semiconductor devices having an arbitrarily shape can't be diced with conventional dicing tools.

Hence, there is a need to place arbitrarily shaped chips with improved accuracy and throughput compared to state of the art. This transfer may be executed using conventional post-processing equipment.

SUMMARY

In aspect, a method is disclosed for placing on a carrier substrate a semiconductor device, the method comprising: providing a semiconductor substrate comprising a rectangular shaped assist chip which comprises at least one semiconductor device surrounded by a metal-free border, dicing the semiconductor substrate to singulate the rectangular shaped assist chip, providing a carrier substrate having adhesive thereon, transferring to and placing on the carrier substrate the rectangular shaped assist chip, thereby contacting the adhesive with the assist chip at least at the location of the semiconductor device, and; singulating the semiconductor device, while remaining attached to the carrier substrate by the adhesive, by removing the part of rectangular shaped assist chip other than the semiconductor device. This at least one semiconductor device can have a shape other than being rectangular. More than on semiconductor device, of any shape, can be contained by the assist chip. The carrier substrate may contain markers for aligning the assist chip when being placed thereon. On the carrier substrate a support may be formed at each location where a semiconductor device is to be placed and the adhesive is then provided on each support. While the semiconductor device remains attached to the carrier substrate by the adhesive, the semiconductor device can be post-processed.

In another aspect, a carrier substrate is disclosed comprising at least one rectangular shaped assist chip which comprises a semiconductor device surrounded by a metal-free border, the assist chip being attached by an adhesive to the carrier substrate at least at the location of a semiconductor device. This assist chip can contain multiple semiconductor devices of arbitrary shape. At least one semiconductor device may have a shape other than rectangular.

In another aspect, a semiconductor substrate is disclosed comprising at least one rectangular shaped assist chip which comprises at least one semiconductor device surrounded by a metal-free border. This assist chip can contain multiple semiconductor devices of arbitrary shape. At least one semiconductor device may have a shape other than rectangular.

BRIEF DESCRIPTION OF THE FIGURES

The above, as well as additional, features will be better understood through the following illustrative and non-limiting detailed description of example embodiments, with reference to the appended drawings.

FIGS. 5a-b illustrate an example embodiment, with (a) being a top view and (b) a cross-sectional view AA.

FIGS. 6a-b illustrate an example embodiment, with (a) being a top view and (b) a cross-sectional view AA.

FIGS. 8a-b illustrate an example embodiment, with (a) being a top view and (b) a cross-sectional view AA.

FIGS. 9a-b illustrate an example embodiment, with (a) being a top view and (b) a cross-sectional view AA.

FIGS. 10a-b illustrate an example embodiment, with (a) being a top view and (b) a cross-sectional view AA.

FIGS. 12a-b illustrate an example embodiment, with (a) being a top view and (b) a cross-sectional view AA.

FIGS. 13a-b illustrate an example embodiment, with (a) being a top view and (b) a cross-sectional view AA.

Figure 1B:
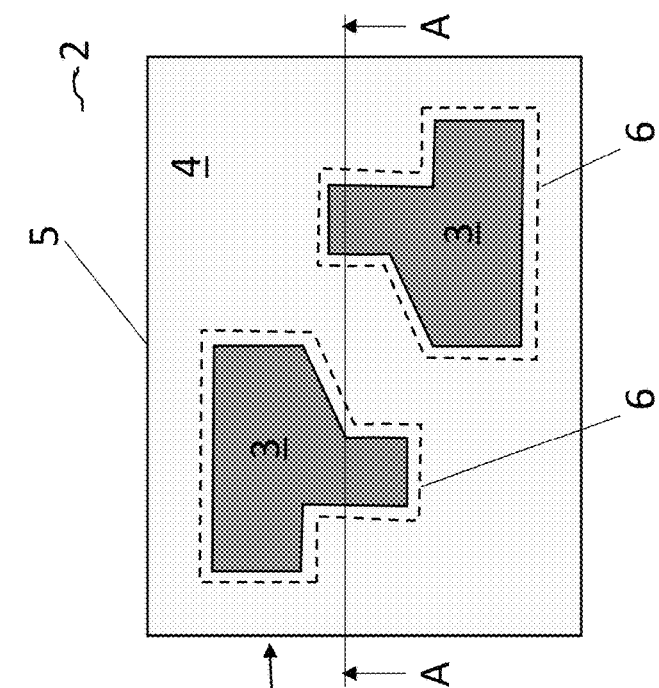
FIGS. 1a-d illustrate an example embodiment, with (a), (b) being top views and (c), (d) being cross-sectional views AA.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description with chip is meant a piece of semiconductor material, in and/or on which structures can be defined using semiconductor process technology. With semiconductor device is meant the combination of patterned and un-patterned layers forming a functional structure.

Semiconductor process technology refers to the state-of-art technology of integrated processing whereby layers are formed on a semiconductor substrate to form a semiconductor device. Post-processing refers to the processing of semiconductor devices after they have been formed using semiconductor technology processing. Post-processing is done on the diced chip containing the semiconductor device. Post-processing may refer to packaging the diced chip or to forming additional patterned and un-patterned layers on the diced chips, optionally connecting diced chips.

A method is disclosed for transferring to and placing on a substrate a semiconductor device thereby maintaining the alignment accuracy of conventional semiconductor tools used to manufacture these semiconductor devices. Thanks to this alignment accuracy, during post-processing, simultaneously lithographic patterning of the transferred semiconductor devices is possible, with even increased accuracy over state-of-the-art technology. Moreover, this method is not limited to rectangular shaped semiconductor devices, but enables transfer, placing and further processing on semiconductor devices having a random shape. This method enables more than one semiconductor device to be transferred in parallel to a substrate.

On a semiconductor substrate (1), within the boundary of a rectangular shaped chip (2), multiple semiconductor devices (3) are formed in parallel using conventional semiconductor processing.

Figure 1A:
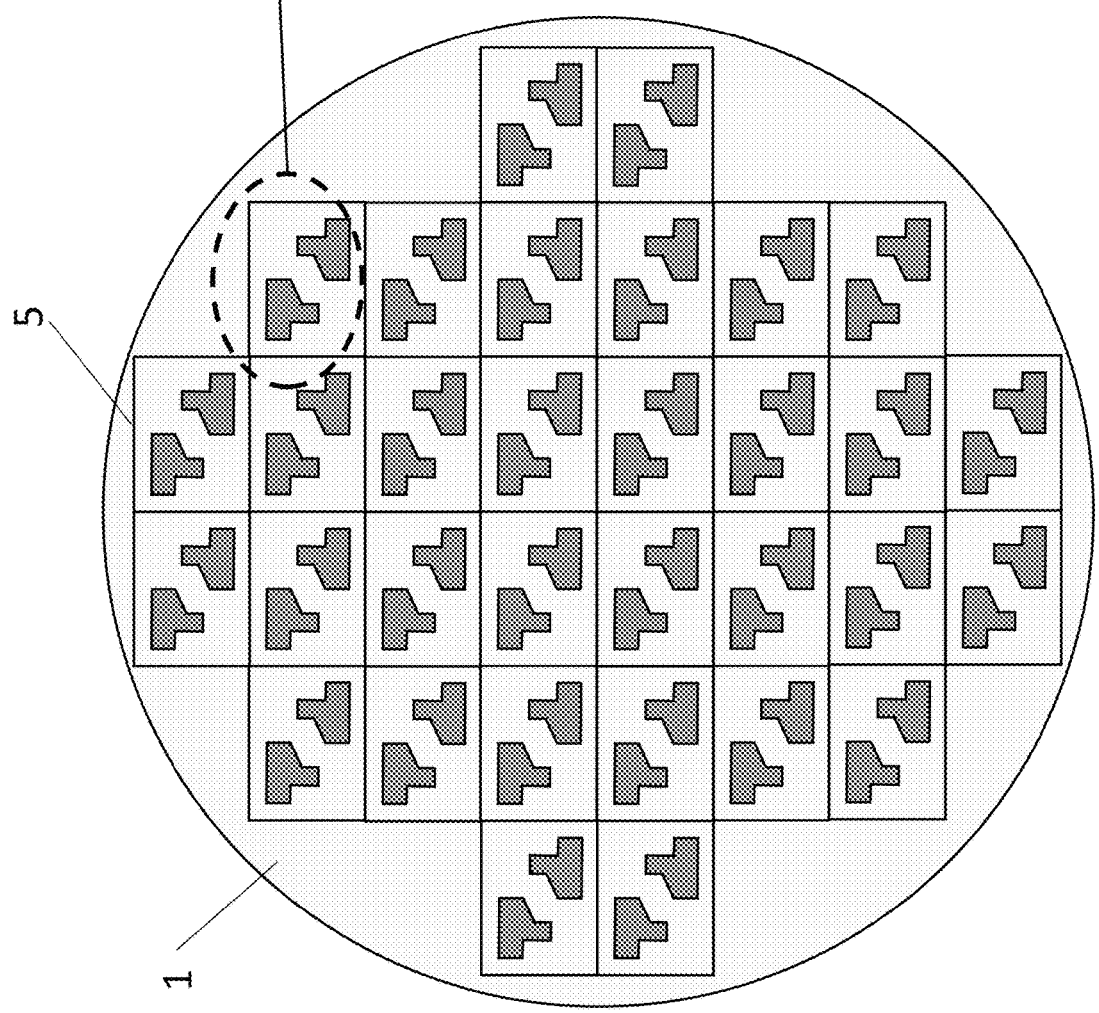

These semiconductor devices (3) can be Integrated Circuits, micro-electromechanical devices (MEMS) or a combination thereof. For Integrated Circuits active and/or passive components are created in the so-called Front-End-Of-Line, whereby these components are electrically connected in the so-called Back-End-Of-Line formed thereupon. The smaller semiconductor devices (3) are positioned relatively to each-other on the predetermined position they need to have on the common substrate to which they (3) will be transferred to and placed on after dicing. The semiconductor devices (3) are hence in a fixed positional relationship towards each-other. These semiconductor devices (3) may be rectangular in shape, but can have any arbitrary shape. Each semiconductor device (3) is surrounded by a metal-free border (6) outlining the semiconductor device (3), as indicated in FIGS. 1a-b by the dotted line. As will be disclosed in subsequent paragraphs, the absence of metal in the border (6) eases removal of the material present in this border (6) when separating the multiple semiconductor devices (3) after transfer thereof. During the semiconductor processing of the substrate (1), care should be taken to avoid the presence of metal in this border (6). Typically, this border (6) has a width in the range of 100 to 300 micrometer (um). Although in FIGS. 1a-c, the 'assist chip' (2) only contains two semiconductor devices (3), the disclosure is not limited thereto.

The rectangular shaped chip (2) is referred to as 'assist chip'. As can be seen in FIGS. 1a-b, only part of the area of the 'assist chip' (2) will be taken up by the semiconductor devices (3). The remaining area of the 'assist chip' (2) outside the border (6) is referred to as 'semiconductor frame' (4). Within this frame (4) additional patterns (not shown), such as dummy patterns, can be present as may be necessitated for correct semiconductor processing of the semiconductor devices (3). Also test structures and/or alignment patterns may be present in the frame (4). The area of the 'semiconductor frame' (4) should be as small as possible to increase the yield of the semiconductor processing. The minimal spacing between the semiconductor devices (3) is inter alia also determined by the area needed to package the semiconductor devices (3). As seen in FIG. 1a, the semiconductor substrate (1) contains a pattern of rectangular shaped chips (2) separated by conventional scribe lines (5). The semiconductor substrate (1) will be diced into individual chips (2) along these scribe lines (5), whereby each chip (2) corresponds to an 'assist chip' (2) comprising multiple semiconductor devices (3).

Figure 1C:
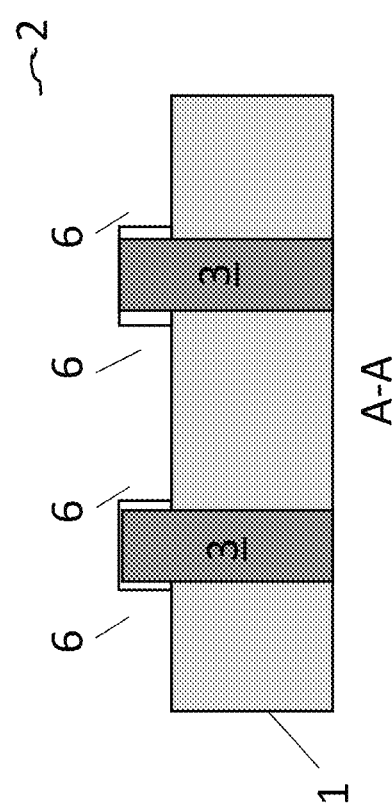
Figure 1D:
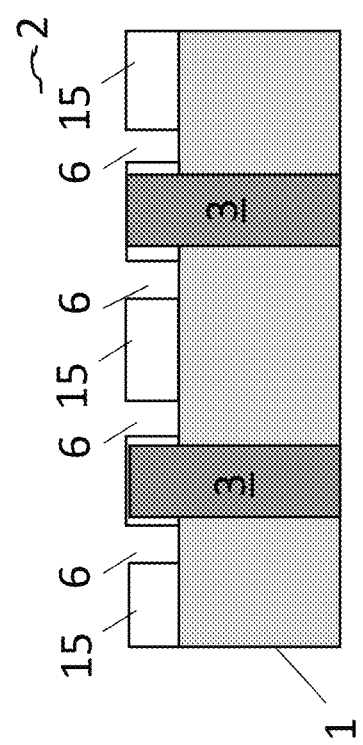

Optionally, as illustrated by the cross-section A-A of by FIG. 1(c), the material (15), typically Back-End-Of-Line material, in the border (6) is removed down to the semiconductor substrate (2) thereby forming corresponding trenches surrounding each semiconductor device (3). This removal can be done using conventional lithographic patterning of the border (6). If no metal patterns are included in the frame (4), e.g. if the semiconductor devices (3) are MEMS devices, then all material in the frame (4) on top of the semiconductor substrate (1) can be removed as illustrated by the cross-section A-A of FIG. 1(d).

The semiconductor substrate (2) is now ready to be diced. Using conventional dicing processes, each rectangular 'assist chip' (2) is singulated. Optionally the semiconductor substrate (1) can be further thinned, e.g. by grinding, to reduce the overall thickness of the diced chip.

Figure 2A:
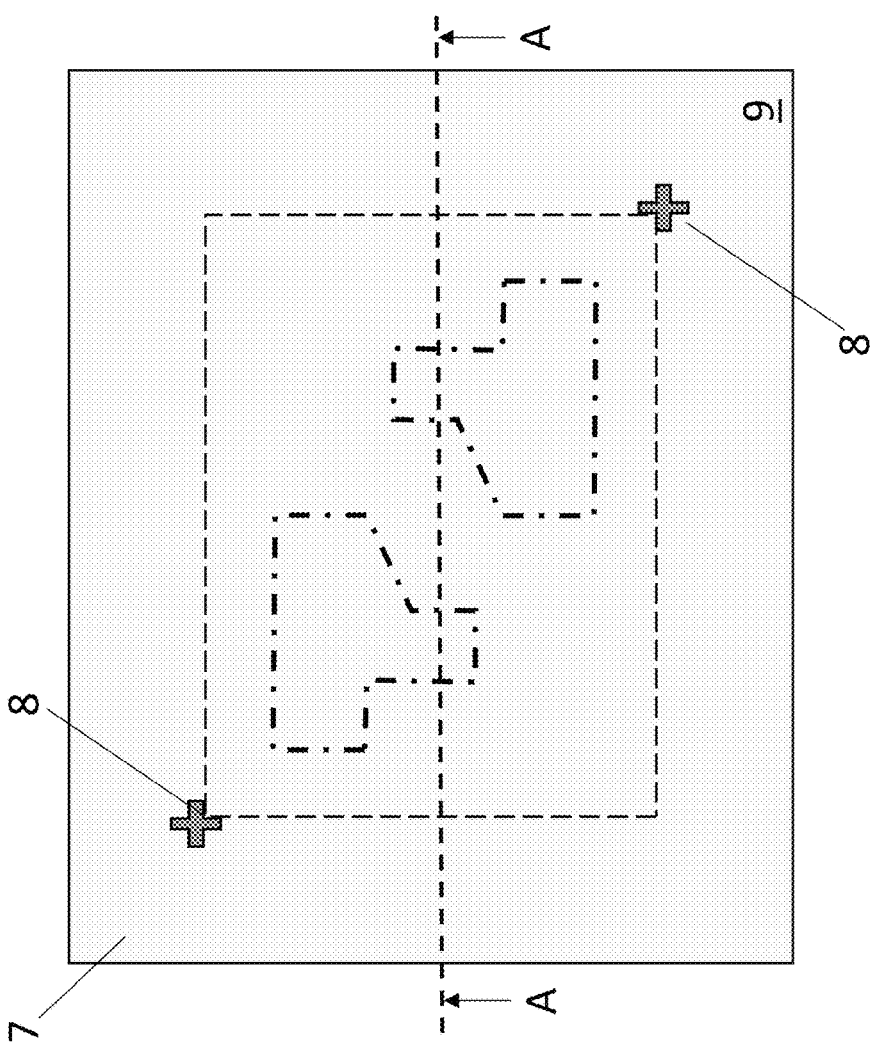
FIGS. 2a-b illustrate an example embodiment, with (a) being a top view and (b) a cross-sectional view AA.
Figure 2B:
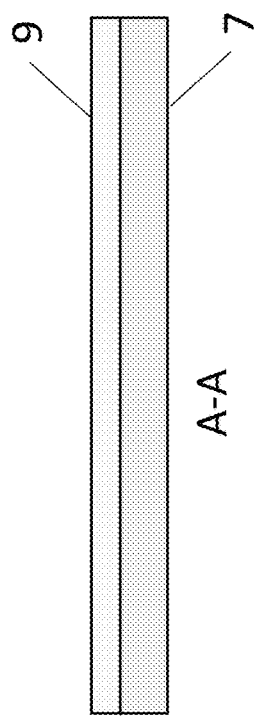

A carrier substrate (7) is provided to which a singulated 'assist chip' (2) can be transferred to and placed upon using conventional pick-and-place tools. On this carrier substrate (7) alignment marks (8) are provided allowing accurate positioning of the 'assist chip' (2), as illustrated in FIG. 2a. Typically these alignment markers (8) are formed in an optically visible layer (9) present on the substrate (7). The dotted lines in FIG. 2a indicate the position of the 'assist chip' (2). The dot-point lines in FIG. 2a and the semiconductor devices (3) when placed on the carrier substrate (7).

Figures 3A, 3B:
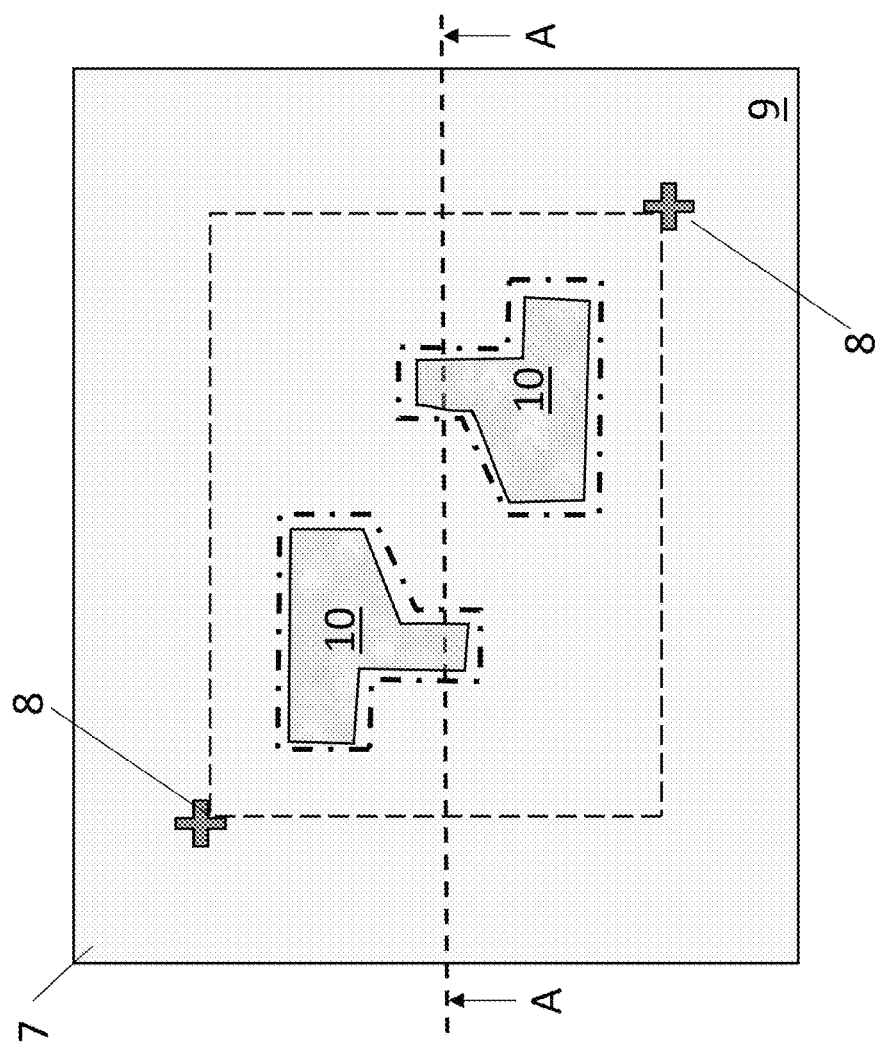
FIGS. 3a-b illustrate an example embodiment, with (a) being a top view and (b) a cross-sectional view AA.

The 'assist chip' can be fixed, e.g. face-up, directly on the carrier substrate (7) by providing adhesive (10) on the carrier substrate (7). If this adhesive is only provided at locations corresponding to the position of the semiconductor devices (3) when being placed on the carrier substrate (7), then these alignment markers (8) may accurately align the 'assist chip' (2), and hence the semiconductor devices (3), to the locations containing the adhesive (10). As shown in FIG. 3a, this adhesive (10) is applied within the dash-dotted lines indicating the future location of the semiconductor devices (3). Restricting the adhesive to these locations, may be necessitated by the fact that the adhesive (10) is difficult to remove from the carrier substrate (7), in particular after curing of the adhesive, or the adhesive may not be exposed to further processing after placing the 'assist chip' (2). Otherwise, the adhesive can be applied over a sufficiently large area in which the 'assist chip' (2) can be placed thereby adhering to the carrier substrate (7). Depending on the alignment accuracy, alignment markers (8) may still be used, even if the whole of the 'assist chip' (2) is adhered to the carrier substrate (7).

Figure 4A:
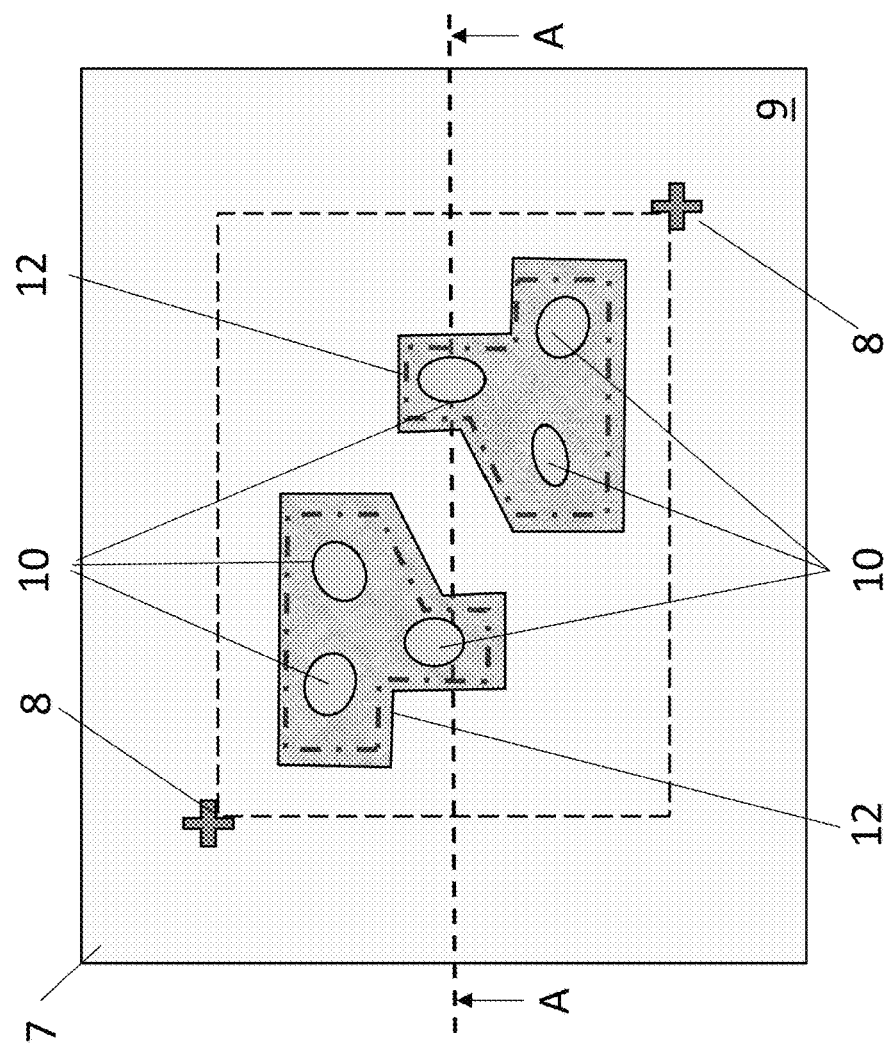
FIGS. 4a-b illustrate an example embodiment, with (a) being a top view and (b) a cross-sectional view AA.
Figure 4B:
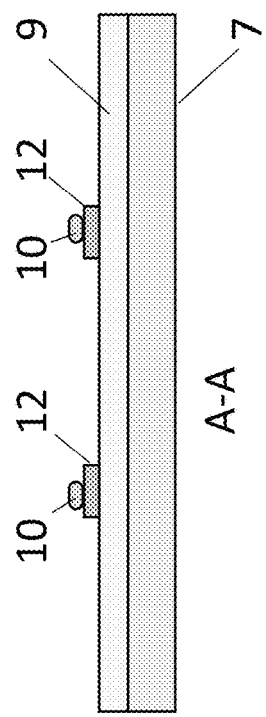
Figure 7B:
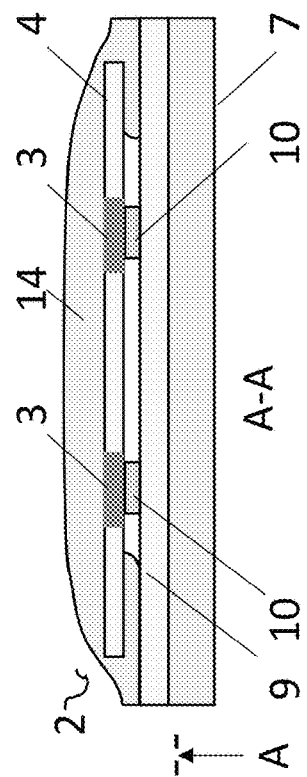
FIGS. 7a-b illustrate an example embodiment, with (a) being a top view and (b) a cross-sectional view AA.
Figure 7A:
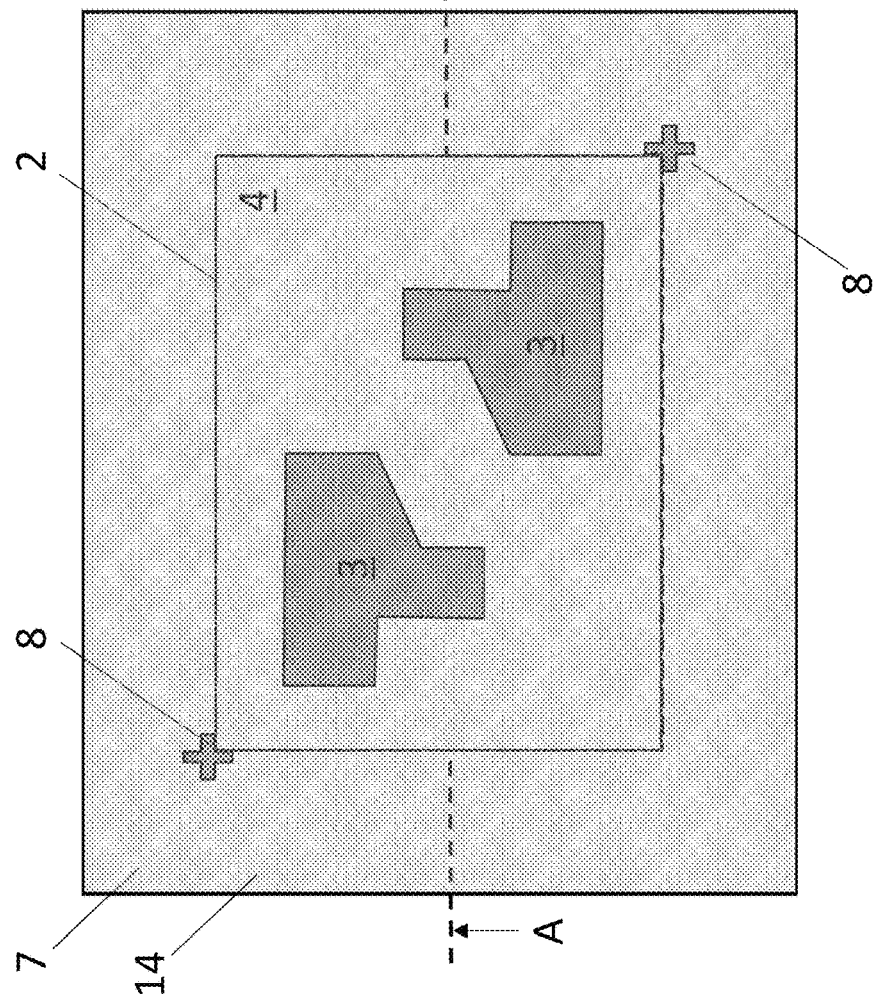

Alternatively, a support layer (11) (not shown) is formed on the carrier substrate (7). This support layer (11) is patterned to form a support (12) at locations corresponding to the position of the semiconductor devices (3) when placed in face-up direction on the carrier substrate (7). As illustrated in FIG. 4a this support extends beyond the footprint of the semiconductor devices (3) indicated by the dot-point lines. Thanks to this extension, some misalignment of the 'assist chip' (2) when being placed on the carrier substrate (7), can be tolerated. Optionally, the alignment marks (8) can be patterned in the support layer (11) as well, in which case layer (9) may become unnecessary. On the supports (12) adhesive (10) is applied, either as dots as shown in FIG. 4a-b, or uniform over the surface of the support (12).

This method may allow the excess adhesive on thinned 'assist chips' (2), e.g. less than 100 micrometer, typically less than 50 micrometer, to stay underneath the 'assist chip' (2) when applied locally. Even if such excess adhesive would extend above the height of the 'assist chip' (2) when placed on the carrier substrate (7), the dimension of the 'assist chip' (2) (i.e. providing sufficient margin between the border of the 'assist chip' (2) and the border (6) surrounding the semiconductor device (3)) will prevent the adhesive (10) from reaching the semiconductor device (3).

It is also possible to place to assist chip (2) faced-down, hence with the metal bondpads facing towards the carrier substrate (7). In this case, the substrate (7) should carry the suitable metallization patterns prior to chip placement, to ensure that the correct electrical interconnections are realized between a metal bondpad of a device (3) and the metallization pattern. The placement can be done by using i.e. flip-chip technology, to realize a conductive connection between the metallization pattern and the bondpads of the semiconductor devices (3), while sufficient adhesion is realized between the semiconductor devices (3) and the carrier substrate (7). This is further illustrated by FIGS. 18, 19 and 20.

To the carrier substrate (7), the singulated 'assist chip' (2) is transferred and placed upon, thereby making physical contact with the adhesive (10). Thanks to the alignment markers (8) present, the 'assist chip' (2) can be accurately positioned on the carrier substrate (7) ensuring the desired position of the semiconductor devices (3) towards the carrier substrate (7) while maintaining their relative position. Thanks to the rectangular shape of the 'assist chip', conventional pick-and-place tools can easily be used for this transfer, alignment and placement.

FIGS. 5a-b illustrate the embodiment where the adhesive (10) is applied directly to the carrier substrate (7).

FIGS. 6a-b illustrate the embodiment whereby a support (12) is present on the carrier substrate (7) prior to applying the adhesive (10). After placing the 'assist chip' (2), the adhesive (10) is cured to ensure adhesion between the semiconductor substrate (1) and the carrier substrate (7) at the location of the semiconductor devices (3).

Once the semiconductor devices (3) are adhered to the carrier substrate (7) by the adhesive (10), these semiconductor devices (3) can also be singulated. A photoresist layer (14) is applied over the carrier substrate (7) as shown in FIGS. 7a-b and FIGS. 8a-b. Due the spacing between the 'assist chip' (2) and the carrier substrate (7) resist may flow underneath the 'assist chip' (2). This photoresist layer (14) is then patterned to remain on the location of the semiconductor devices (3) while the frame (4) is uncovered. Traces of photoresist may remain underneath the 'assist chip' (2), at least near the edge thereof. The pattern of the photoresist layer (3) may extend over the border of the semiconductor device (3) to ensure that the semiconductor device (3) remains protected.

FIGS. 7a-b and FIGS. 9a-b illustrate the embodiment where the adhesive (10) is applied directly to the carrier substrate (7). The photoresist layer (14) is patterned whereby traces of photoresist remain underneath the 'assist chip' (3).

FIGS. 8a-b and FIGS. 10a-b illustrate the embodiment whereby a support (12) is present on the carrier substrate (7) prior to applying the adhesive (10). The photoresist layer (14) is patterned whereby traces of photoresist remain underneath the 'assist chip' (3).

As the semiconductor devices (3) are protected by the patterned photoresist layer (14), the frame (4) can be removed if no metal is present. After removal of the frame (4), the photoresist (14) on the semiconductor devices (3), and if present on the carrier substrate (7) is removed. Attached to and aligned to carrier substrate (7), the semiconductor devices (3) remain in their relative position as defined during the processing of the semiconductor substrate (1).

In FIGS. 1(c) and (d) it was shown that either the metal-free border (c) or the metal-free border (d) was removed down to the level of the semiconductor substrate (1). This removal process can be executed on wafer level and is more efficient. After placing the diced chip (2) on the carrier substrate (7), only the semiconductor substrate part of the frame (4) is to be removed to singulate the semiconductor devices (3).

Figure 11B:
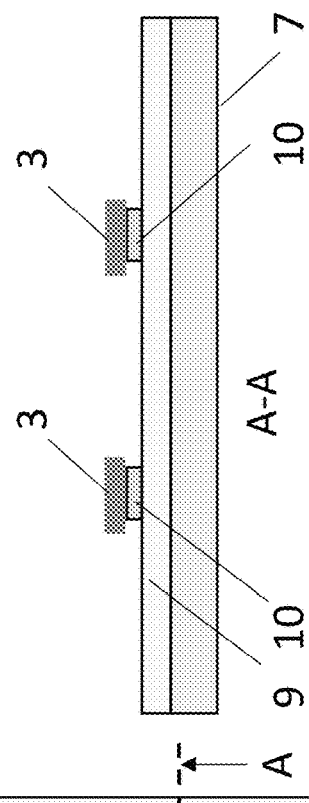
FIGS. 11a-b illustrate an example embodiment, with (a) being a top view and (b) a cross-sectional view AA.
Figure 11A:
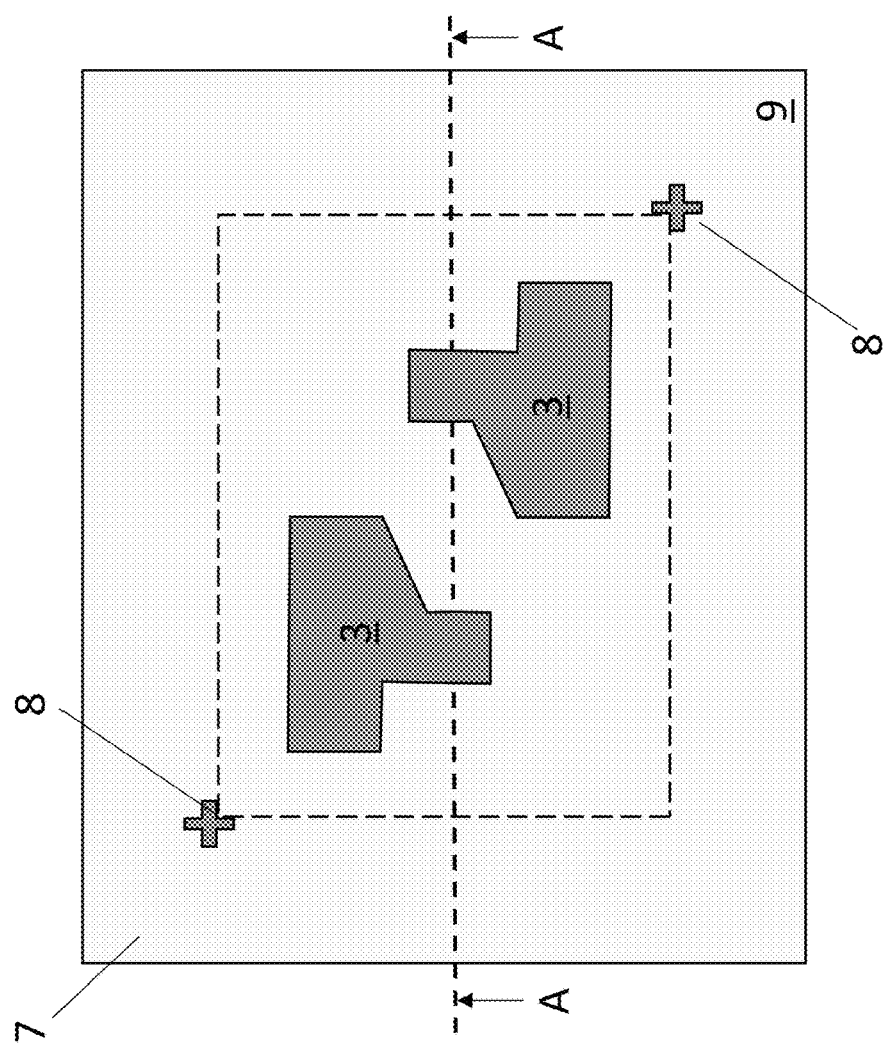
Figure 14B:
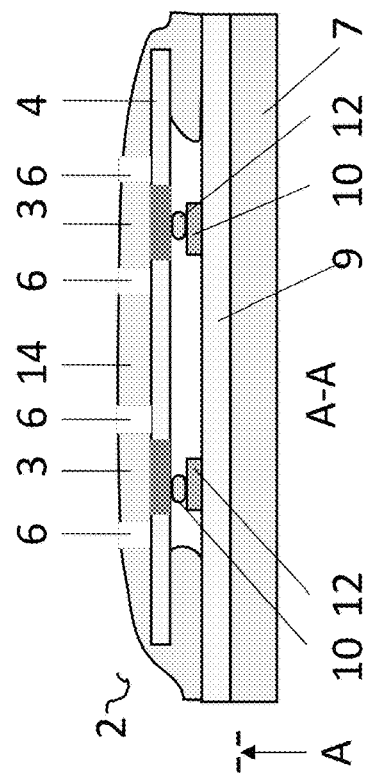
FIGS. 14a-b illustrate an example embodiment, with (a) being a top view and (b) a cross-sectional view AA.
Figure 14A:
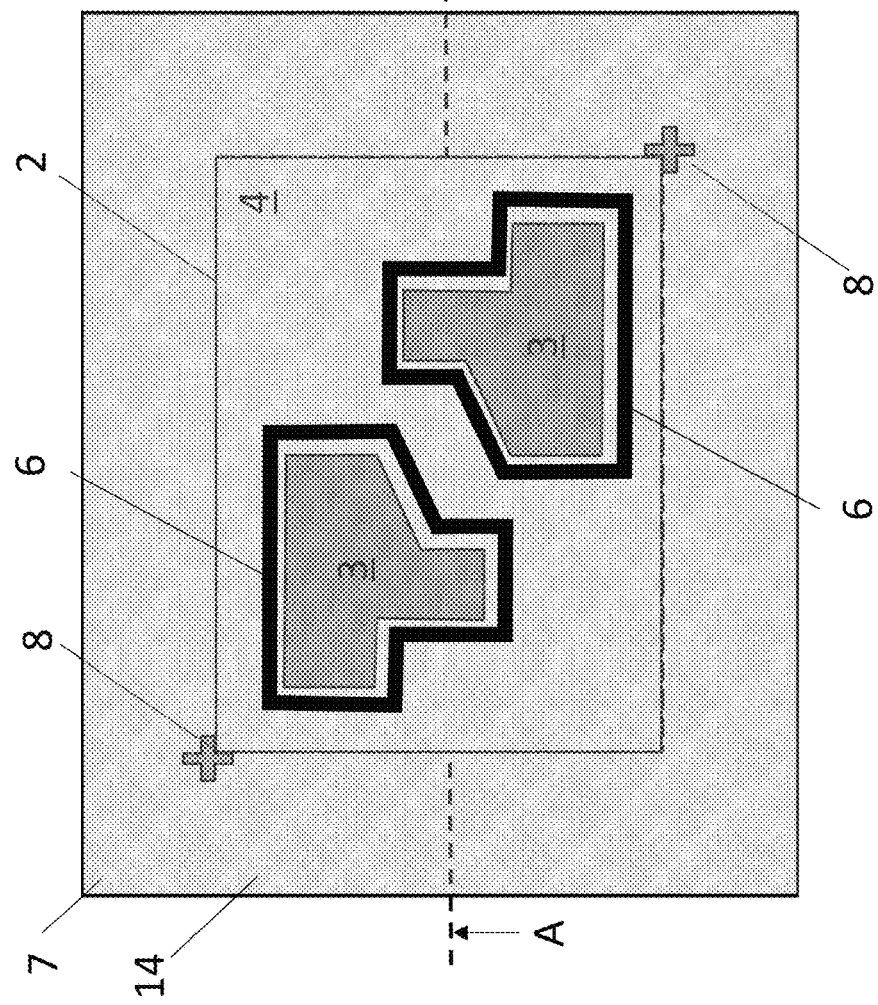

FIGS. 11a-b illustrate the embodiment where the adhesive (10) is applied directly to the carrier substrate (7).

FIGS. 12a-b illustrate the embodiment whereby a support (12) is present on the carrier substrate (7) prior to applying the adhesive (10).

Instead of singulating the semiconductor devices (3) by removing the complete frame (4), only the metal-free border (6) can be removed. A photoresist layer (14) is applied over the carrier substrate (7) as shown in FIGS. 13a-b and FIGS. 14a-b. Due the spacing between the 'assist chip' (2) and the carrier substrate (7) resist may flow underneath the 'assist chip' (2). This photoresist layer (14) is then patterned to remain outside the area of the border (6) thereby creating trenches (6) in the photoresist layer (14) surrounding the semiconductor devices (3). Traces of photoresist may remain underneath the 'assist chip' (2), at least near the edge thereof. The pattern of the photoresist layer (3) may extend over the border of the semiconductor device (3) to ensure that the semiconductor device (3) remains protected. Then the material of the border (6) is etched. The part of the frame (4) covered by the photoresist pattern (14) remains. After the etch step, the photoresist on top of the semiconductor devices (3) and of the remaining frame (4) is removed, thereby exposing the remaining part of the frame (4). When removing the traces of the photoresist (14) that were present underneath the 'assist chip' (2), this remainder of the frame (4) will be lifted-off from the carrier substrate (7). This again results in the configuration illustrated by FIGS. 11a-b and FIGS. 12a-b, as the semiconductor devices (3) remain attached by the adhesive (10) during this photoresist (14) removal process. Attached to and aligned to carrier substrate (7), the semiconductor devices (3) remain in their relative position as defined during the processing of the semiconductor substrate (1).

The semiconductor devices (3) can now be further processed, as they remain in their relative position as defined accurately during the processing of the semiconductor substrate (1), while being attached and accurately aligned to carrier substrate (7). This allows post-processing of these semiconductor devices (3), even when small patterns are to be formed upon these semiconductor devices (3), e.g. when parts of the semiconductor devices (3) need to be connected with each-other or with other devices present on or to be formed on the carrier substrate (7).

In the FIGS. 1 to 14 used to illustrate the methods of this disclosure, the semiconductor devices (3) were of equal shape and size. This is not a requirement. As already indicated above, the methods according this disclosure, allow any shape and size of the semiconductor devices (3) contained within the boundary of the 'assist chip' (2). Within one 'assist chip' (2) one can design multiple semiconductor devices (3), each having a different layout, shape and size. After transferring and singulating these semiconductor devices (3), as disclosed above, one can create any desired connection between singulated semiconductor devices (3). This may result, after packaging, in a single system containing multiple arbitrarily shaped semiconductor devices, accurately aligned to each-other with the desired, small size, interconnect pattern.

Figure 15:
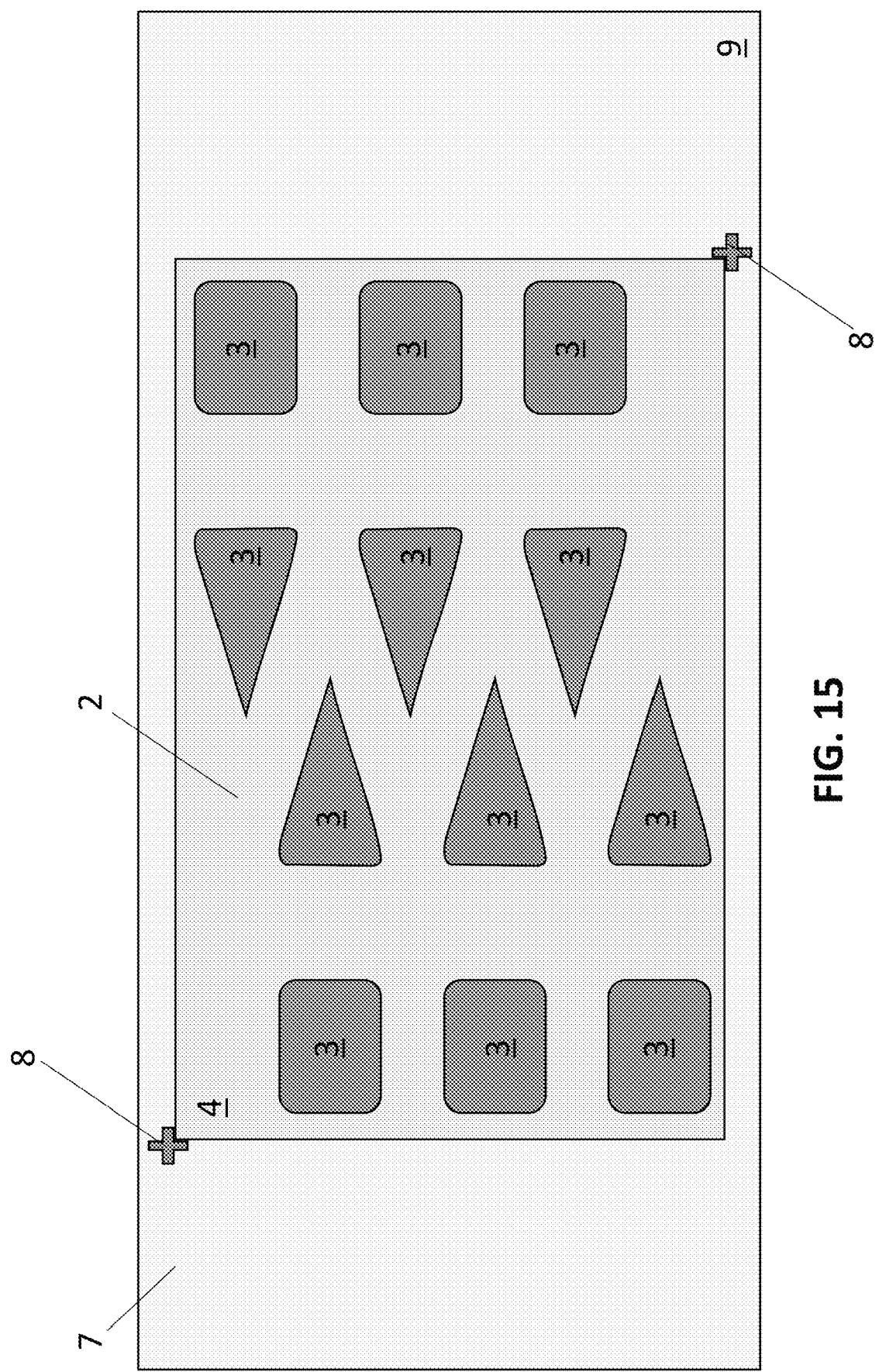
FIG. 15 illustrates multiple semiconductor devices of different type contained in a single assist chip, according to an example embodiment. The assist chip is placed on the substrate using the alignment markers for correct positioning. The semiconductor devices are placed in the face-up direction.
Figure 16:
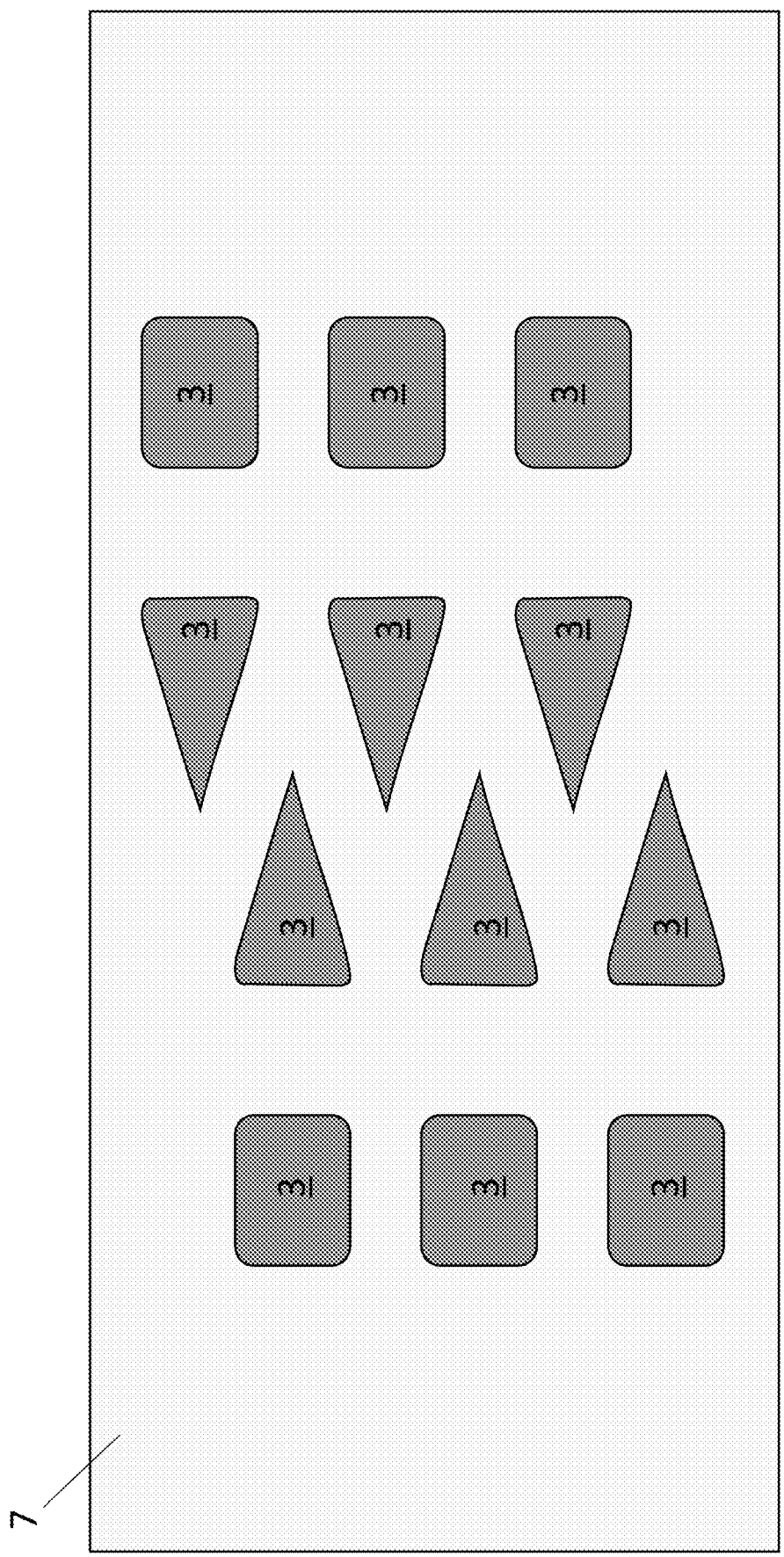
FIG. 16 illustrates multiple semiconductor devices of different type, previously contained in a single assist chip, after removal of the frame to singulate the individual semiconductor devices, according to an example embodiment.
Figure 17:
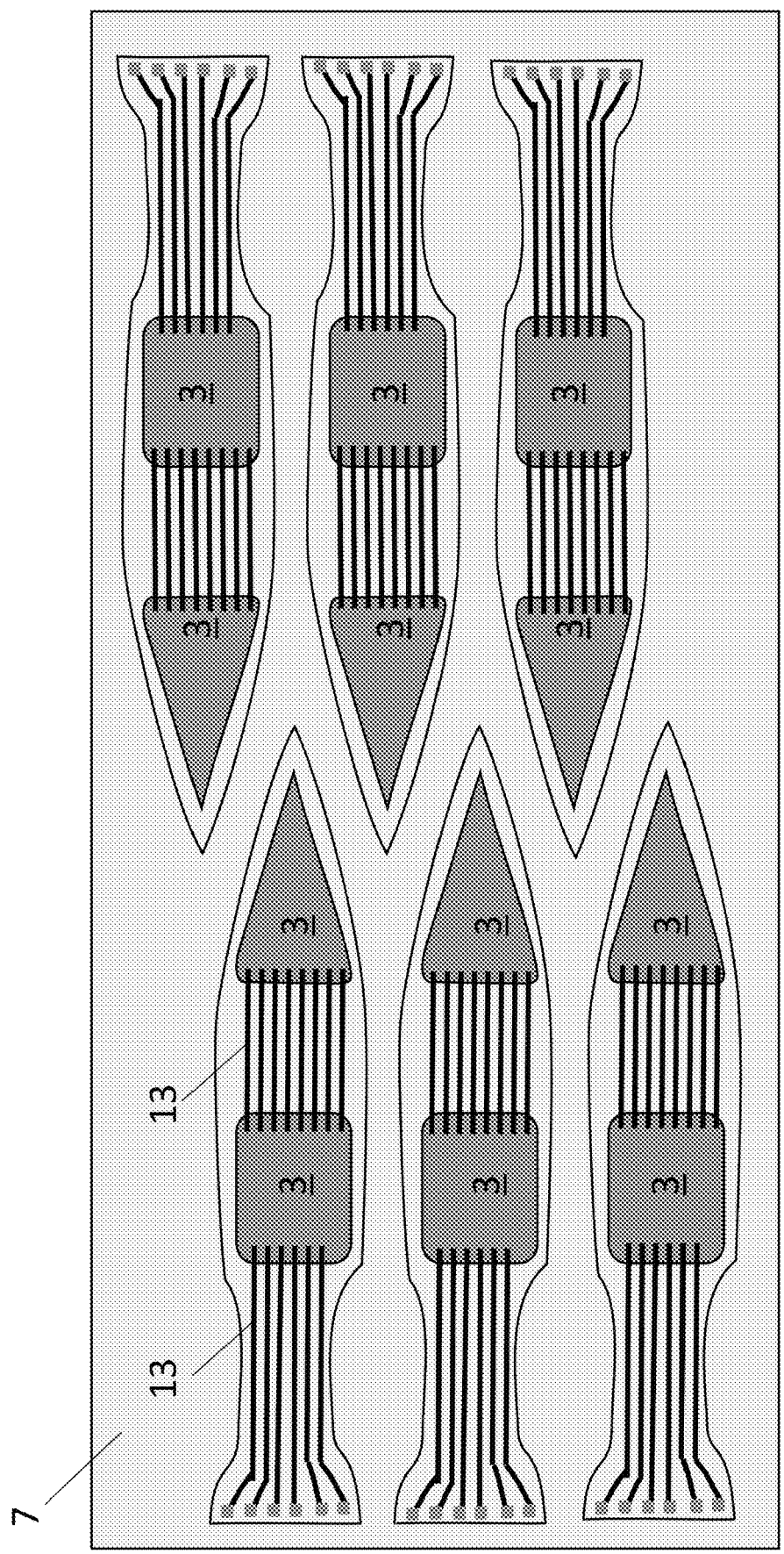
FIG. 17 illustrates a system containing post-processed semiconductor devices of two different types, according to FIG. 15, connected to each-other with metal interconnects.

FIG. 15, FIG. 16 and FIG. 17 illustrate the manufacturing of such a system, for the situation of face-up chip placement. FIG. 15 shows an 'assist chip' (2), counting 6 semiconductor devices (3), after being transferred to and attached to the carrier substrate (7). Two types of semiconductor devices, identified as square or triangle, are present in the 'assist chip' (2). The devices (3) are ready to be singulated. FIG. 16 shows the result after singulation of the semiconductor devices (3) by removing the frame (4). FIG. 17 shows, after further processing, how these devices (3) are connected in pairs to yield a final system, containing 2 different semiconductor devices (3) connected to each-other and having an connection pattern (13) to access these semiconductor devices (3) from outside. Here the connection pattern (13) is formed after the transfer of the 'assist ship '2' and the singulation of the semiconductor devices (3).

Figure 18:
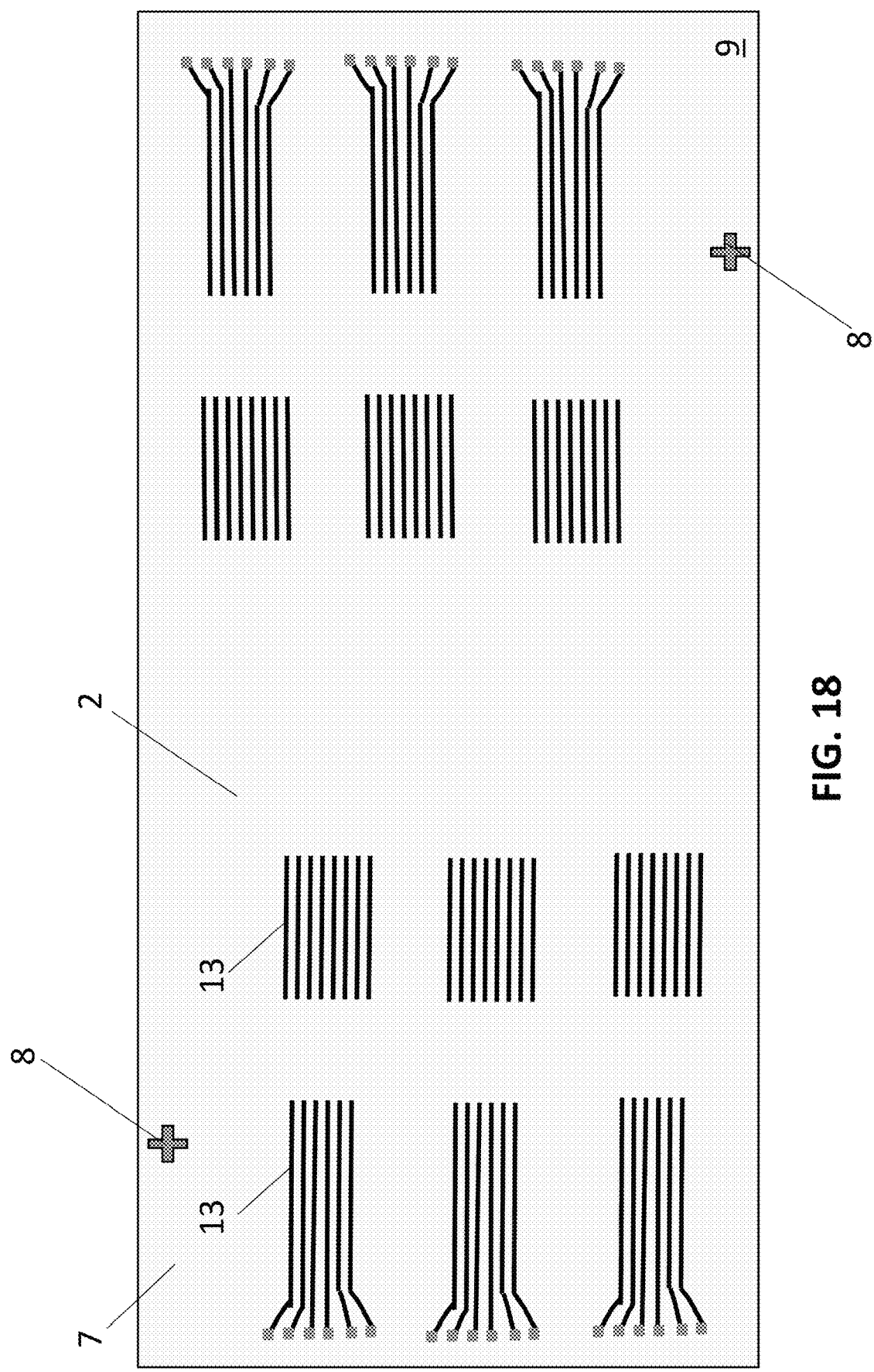
FIG. 18 illustrates the substrate including metal interconnects, prior to the placement of a multiple semiconductor devices of two different types contained in a single assist chip, according to an example embodiment.
Figure 19:
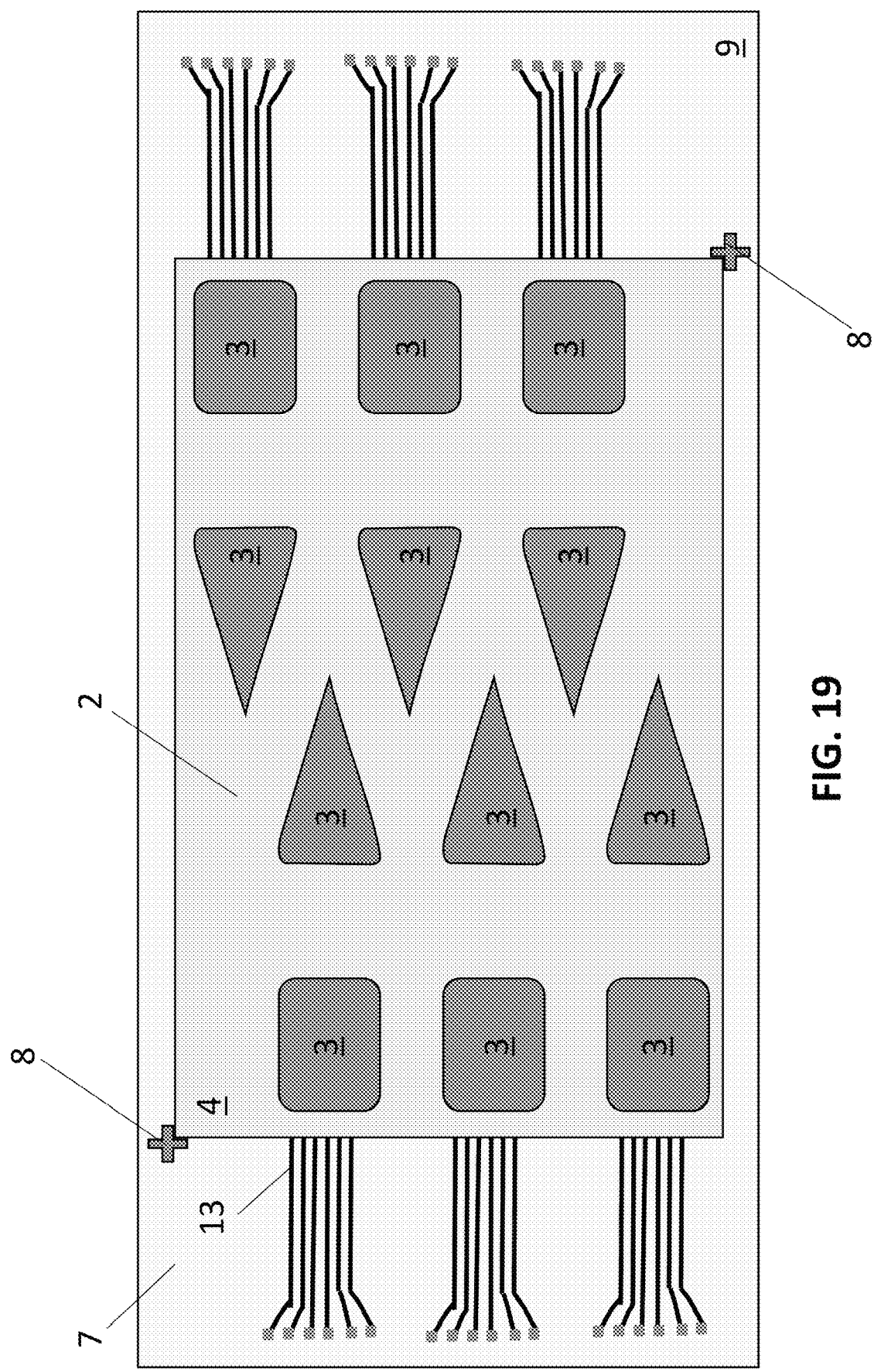
FIG. 19 illustrates the substrate including metal interconnects, after the placement of multiple semiconductor devices of different two type contained in a single assist chip, according to FIG. 18. The semiconductor devices are placed in the face-down direction (i.e. flip chipped). The assist chip is placed on the substrate using the alignment markers for correct positioning, to ensure that the semiconductor devices are contacting the metallization pattern on the substrate at the desired location.
Figure 20:
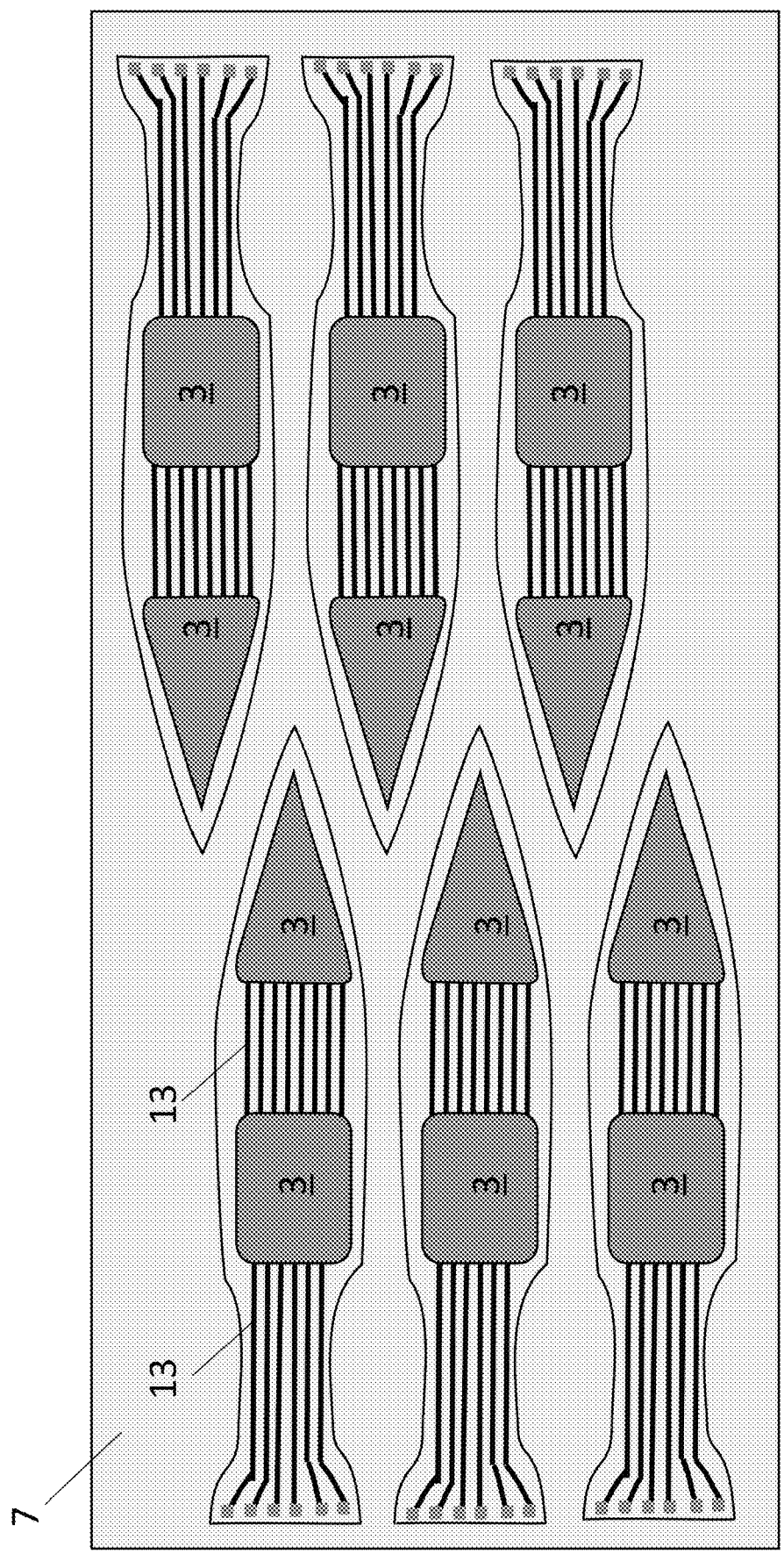
FIG. 20 illustrates multiple semiconductor devices of two different types, previously contained in a single assist chip according to FIG. 19, after removal of the frame to singulate the individual semiconductor devices of different type, which have been placed face-down on the substrate with metal patterns. Further post-processing results in a system containing two semiconductor devices of different type connected to each-other.

FIG. 18, FIG. 19 and FIG. 20 illustrate the manufacturing of such a system, for the situation of face-down chip placement. FIG. 18 shows the carrier substrate (2) prepared for face-down chip placement. The substrate contains the alignment marks (8) and the metallization pattern for the final system. FIG. 19 shows an 'assist chip' (2), counting 6 semiconductor devices (3), after being transferred faced-down and attached to the carrier substrate (7). Two types of semiconductor devices, identified as square or triangle, are present in the 'assist chip' (2). The devices (3) are ready to be singulated. FIG. 20 shows the result after singulation of the semiconductor devices (3) by removing the frame (4), and after further processing to define the final system, containing 2 different semiconductor devices (3) connected to each-other and having a connection pattern to access these semiconductor devices (3) from outside. Here the connection pattern (13) is formed after the transfer of the 'assist ship '2' and the singulation of the semiconductor devices (3).

In the foregoing paragraphs, a rectangular shaped chip (2) comprising multiple semiconductor devices (3) was manufactured on a semiconductor substrate (1). The disclosed method for transferring and placing the rectangular shaped chip (2) can also be applied if the 'assist chip' only contains semiconductor device (3) having a shape other than rectangular. Such arbitrarily shaped semiconductor device (3) can be transferred and placed using conventional pick-and-place tools. After removing the frame, the singulated semiconductor device (3) remains attached to the carrier substrate (3) and is ready for further processing.

In the foregoing paragraphs, the carrier substrate (7) was provided with alignment markers (8) for correctly positioning the rectangular shaped chip (2) thereon. If this alignment is less critical then these alignment markers (8) may not be needed.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for placing on a carrier substrate a semiconductor device, the method comprising:
   providing a semiconductor substrate comprising a rectangular shaped assist chip which comprises at least one arbitrarily shaped semiconductor device surrounded by a metal-free border;
   dicing the semiconductor substrate to singulate the rectangular shaped assist chip,
   providing a carrier substrate having adhesive thereon;
   transferring to and placing on the carrier substrate the rectangular shaped assist chip, thereby contacting the adhesive with the rectangular shaped assist chip at least at a location of the semiconductor device; and
   defining the semiconductor device, after placing the rectangular shaped assist chip on the carrier substrate and while remaining attached to the carrier substrate by the adhesive, by etching the rectangular shaped assist chip other than the semiconductor device, wherein etching the rectangular shaped assist chip other than the semiconductor device comprises:
   applying photoresist over the carrier substrate;
   patterning the photoresist to remain on the semiconductor device, whereby traces of the photoresist remain between the rectangular shaped assist chip and the carrier substrate; and
   etching the rectangular shaped assist chip to remove a frame of the rectangular shaped assist chip surrounding the semiconductor device.

2. The method of claim 1, wherein at least one arbitrarily shaped semiconductor device has a shape other than rectangular.

3. The method of claim 1, wherein the rectangular shaped assist chip contains multiple arbitrarily shaped semiconductor devices.

4. The method of claim 3, wherein at least one of the multiple arbitrarily shaped semiconductor devices has a shape other than rectangular.

5. The method of claim 1, wherein the carrier substrate contains markers for aligning the rectangular shaped assist chip when being placed thereon.

6. The method of claim 1, further comprising:
   forming on the carrier substrate at each location where an arbitrarily shaped semiconductor device is to be placed a support, wherein the adhesive is provided on each support.

7. The method of claim 1, further comprising:
   post-processing the arbitrarily shaped semiconductor device while remaining attached to the carrier substrate by the adhesive.

8. The method of claim 1, wherein the metal-free border outlines each of the at least one arbitrarily shaped semiconductor device.

9. The method of claim 1, wherein the metal-free border has a width of about 100 to 300 micrometers.

10. The method of claim 3, wherein transferring to and placing on the carrier substrate the rectangular shaped assist chip comprises transferring the multiple arbitrarily shaped semiconductor devices to the carrier substrate in parallel.

11. The method of claim 10, wherein the multiple arbitrarily shaped semiconductor devices each have a different layout, shape, and size.

12. The method of claim 1, wherein defining the semiconductor device comprises etching the rectangular shaped assist chip other than the at least one semiconductor device and not etching the carrier substrate.

13. The method of claim 1, wherein etching the rectangular shaped assist chip other than the semiconductor device further comprises:
   removing the metal-free border surrounding the at least one arbitrarily shaped semiconductor device on the rectangular shaped assist chip, thereby releasing the frame of the rectangular shaped assist chip; and
   lifting the frame of the rectangular shaped assist chip away from the carrier substrate.

14. The method of claim 13, wherein removing the metal-free border surrounding the at least one arbitrarily shaped semiconductor device on the rectangular shaped assist chip comprises removing the metal-free border using lithographic patterning.

15. The method of claim 1, further comprising providing a support between the carrier substrate and the rectangular shaped assist chip, wherein the traces of the photoresist remain between the rectangular shaped assist chip and the carrier substrate based at least in part on the support.

16. The method of claim 15, wherein providing the support comprises patterning a support layer on the carrier substrate to form a support at one or more locations corresponding to a position of the at least one arbitrarily shaped semiconductor device.

17. A system prepared by a process comprising the steps of:
providing a semiconductor substrate comprising a rectangular shaped assist chip which comprises at least one arbitrarily shaped semiconductor device surrounded by a metal-free border;
dicing the semiconductor substrate to singulate the rectangular shaped assist chip,
providing a carrier substrate having adhesive thereon;
transferring to and placing on the carrier substrate the rectangular shaped assist chip, thereby contacting the adhesive with the rectangular shaped assist chip at least at a location of the semiconductor device; and
defining the semiconductor device, after placing the rectangular shaped assist chip on the carrier substrate and while remaining attached to the carrier substrate by the adhesive, by etching the rectangular shaped assist chip other than the semiconductor device, wherein etching the rectangular shaped assist chip other than the semiconductor device comprises:
applying photoresist over the carrier substrate;
patterning the photoresist to remain on the semiconductor device, whereby traces of the photoresist remain between the rectangular shaped assist chip and the carrier substrate; and
etching the rectangular shaped assist chip to remove a frame of the rectangular shaped assist chip surrounding the semiconductor device.

18. The system of claim 17, wherein etching the rectangular shaped assist chip other than the semiconductor device further comprises:
removing the metal-free border surrounding the at least one arbitrarily shaped semiconductor device on the rectangular shaped assist chip, thereby releasing the frame of the rectangular shaped assist chip; and
lifting the frame of the rectangular shaped assist chip away from the carrier substrate.

19. The system of claim 17, the steps further comprising providing a support between the carrier substrate and the rectangular shaped assist chip, wherein the traces of the photoresist remain between the rectangular shaped assist chip and the carrier substrate based at least in part on the support.

20. A carrier substrate prepared by a process comprising the steps of:
providing a semiconductor substrate comprising a rectangular shaped assist chip which comprises at least one arbitrarily shaped semiconductor device surrounded by a metal-free border;
dicing the semiconductor substrate to singulate the rectangular shaped assist chip,
providing a carrier substrate having adhesive thereon;
transferring to and placing on the carrier substrate the rectangular shaped assist chip, thereby contacting the adhesive with the rectangular shaped assist chip at least at a location of the semiconductor device; and
defining the semiconductor device, after placing the rectangular shaped assist chip on the carrier substrate and while remaining attached to the carrier substrate by the adhesive, by etching the rectangular shaped assist chip other than the semiconductor device, wherein etching the rectangular shaped assist chip other than the semiconductor device comprises:
applying photoresist over the carrier substrate;
patterning the photoresist to remain on the semiconductor device, whereby traces of the photoresist remain between the rectangular shaped assist chip and the carrier substrate; and
etching the rectangular shaped assist chip to remove a frame of the rectangular shaped assist chip surrounding the semiconductor device.

* * * * *